US008301027B2

(12) United States Patent
Shaw et al.

(10) Patent No.: US 8,301,027 B2
(45) Date of Patent: Oct. 30, 2012

(54) AGILE-BEAM LASER ARRAY TRANSMITTER

(75) Inventors: Gary A. Shaw, Westford, MA (US); Lawrence M. Candell, Arlington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 776 days.

(21) Appl. No.: 12/316,828

(22) Filed: Dec. 17, 2008

(65) Prior Publication Data

US 2010/0046953 A1 Feb. 25, 2010

Related U.S. Application Data

(60) Provisional application No. 61/126,252, filed on May 2, 2008.

(51) Int. Cl.
*H04J 14/02* (2006.01)
(52) U.S. Cl. .......................... 398/88; 398/118
(58) Field of Classification Search .............. 398/115, 398/116, 118, 164, 156, 151, 140, 131, 129, 398/88, 41, 42, 43, 66, 82, 130
See application file for complete search history.

(56) References Cited

U.S. PATENT DOCUMENTS

| 5,923,475 | A | 7/1999 | Kurtz et al. |
| 6,353,502 | B1 | 3/2002 | Marchant et al. |
| 6,775,480 | B1 * | 8/2004 | Goodwill ...................... 398/158 |
| 6,829,439 | B1 * | 12/2004 | Sidorovich et al. ........... 398/131 |
| 2003/0091084 | A1 | 5/2003 | Sun et al. |
| 2003/0147652 | A1 * | 8/2003 | Green et al. ................... 398/118 |
| 2005/0232628 | A1 * | 10/2005 | von Freyhold et al. ......... 398/41 |
| 2006/0176703 | A1 | 8/2006 | Cayton et al. |
| 2007/0071056 | A1 * | 3/2007 | Chen ........................ 372/50.124 |

FOREIGN PATENT DOCUMENTS

DE 100 07 123 A1 9/2001

OTHER PUBLICATIONS

International Preliminary Report on Patentability mailed Nov. 11, 2010, for International Application No. PCT/US2009/000226, filed Jan. 14, 2009.

(Continued)

*Primary Examiner* — M. R. Sedighian
(74) *Attorney, Agent, or Firm* — Hamilton, Brook, Smith & Reynolds, P.C.

(57) ABSTRACT

An Agile-Beam Laser Array Transmitter (ABLAT) uses an array of emitters and an array of lenses to project electromagnetic beams over a wide angular coverage area in the far field. Differences in the separation pitches of the two arrays allows the ABLAT to project beams to contiguous and/or overlapping positions, depending on the ratio of the separation pitches and the lens focal length. Compared to other beam steering technology, the ABLAT is a smaller, lighter, and more efficient means of projecting beams over wider angular coverage areas. Various embodiments can be used in any beam steering application, including, but not limited to: free-space optical communications; light detection and ranging (lidar); optical scanning (e.g., retinal or bar-code scanning); display projection; image capture; optical character recognition; scanning laser microscopy; non-destructive testing; printing; facsimiles; map making; web inspection; color print processing; phototypesetting and platemaking; laser marking; material processing; DNA analysis; and drug discovery.

92 Claims, 16 Drawing Sheets

OTHER PUBLICATIONS

Notification of Transmittal of the International Search Report and the Written Opinion of the International Searching Authority, or the Declaration, for PCT/US2009/000226, mailed on Sep. 21, 2009.

Schwarze, C., "A New Look at Risley Prisms," *Photonics Spectra*, pp. 67, 69 & 70 (Jun. 2006).

Tuantranont, A., et al., "Optical Beam Steering Using MEMS-Controllable Microlens Array," *Sensors and Actuators*, A 91(3):363-372, (2001).

Ghisoni, M., et al., "Single- and Multimode VCSEL's Operating with Continuous Relief Kinoform for Focussed Spot-Array Generation," *IEEE Photonics Technology Letters* (9)11:1466-1468, (Nov. 1997).

Ghisoni, M., et al., "4×4 Fan-Out Spot Generator Using GaAs Based VCSEL's and Diffractive Optical Element," *IEEE Photonics Technology Letters* (9)4:508-510, (Apr. 1997).

Chen, H-L., et al., "Collimating Diode Laser Beams from a Large-Area VCSEL-Array Using Microlens Array," *IEEE Photonics Technology Letters* (11)5:506-508, (May 1999).

Petrovic, N. S., et al., "Analysis of the Effect of Transverse Modes of Free-Space Optical Interconnect Performance," *Smart Materials and Structures* 15:S147-S153, (2006).

Burns, D. M., "Microelectromechanical Optical Beam Steering Systems," Dissertation presented to the Faculty of the Graduate School of Engineering of the Air Force Institute of Technology Air University, "State-of-the-art Optical MEMS and Their Applications,"pp. 2-10-2-17; "Optical Beam Steering Theory and Modeling" pp. 4-1-4-32 & "Optical Beam Steering Using Decentered Microlenses" pp. 7-1-7-22, (Dec. 1997).

Cheng, W-M., et al., "Analysis of Microlens Arrays Efficient Optical Power Coupling for Vertical Cavity Surface Emission Laser Arrays," *Proceedings of SPIE* vol. 5225 Nano- and Micro-Optics for Information Systems, pp. 145-154 (2003).

Fraces, M., "Hybridization of Fresnel Diffractive Microlenses and VCSELs Arrays for Free Space Optical Interconnections," *SPIE* vol. 3490, pp. 350-353 (May 2008).

Hergenhan, G., et al., "Coherent Coupling of Vertical-cavity Surface-emitting Laser Arrrays and Efficient Beam Combining by Diffractive Optical Elements: Concept and Experimental Verification," *Applied Optics* (42)9:1667-1680, (Mar. 20, 2003).

Hergenhan, G., et al., "Experiments of the Scalability of the Coherent Coupling of VCSEL Arrays," *Proceedings of SPIE* vol. 4649, pp. 158-167, (2002).

Ishii, Y., et al., "Fully SMT-Compatible Optical-I/O Package with Microlens Array Interface," *J. of Lightwave Technol.* (21)1:275-280 (Jan. 2003).

Kim, G., et al., "Characterization of Bi-Directional Optical Backplane and Performance Enhancement with Multi-Bus Lines," *SPIE Conf. on Optoelectronic Interconnects VI*, San Jose, CA, pp. 85-95, (Jan. 1999).

Rodrigo, P. J., et al., "Array of Optical Tweezers with Individual Beam-steering and Polarization Control," *Proc. of SPIE* vol. 5322, pp. 103-107, (2004).

\* cited by examiner

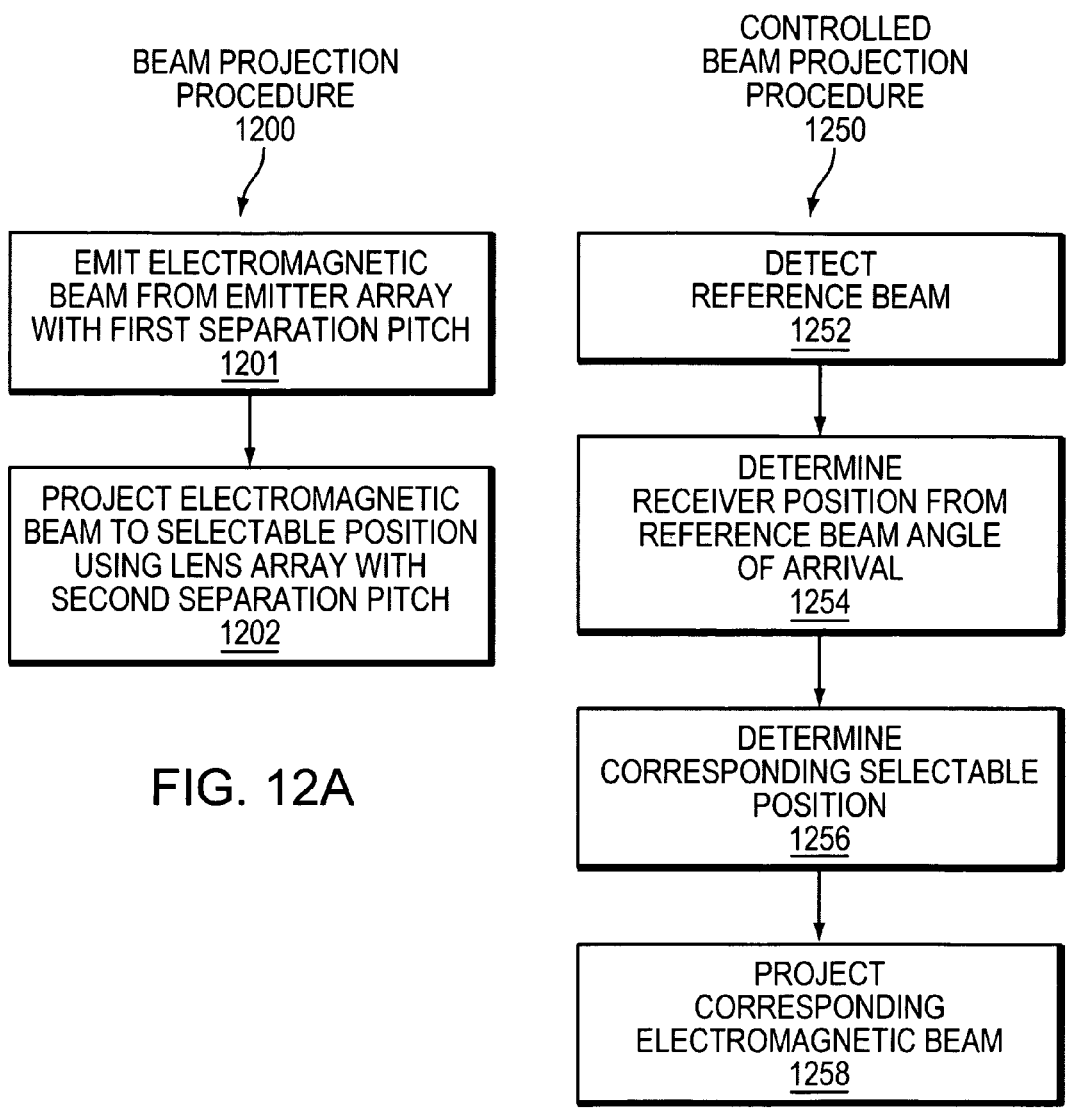

US 8,301,027 B2

AGILE-BEAM LASER ARRAY TRANSMITTER

RELATED APPLICATION

This application claims the benefit of U.S. Provisional Application No. 61/126,252, filed on May 2, 2008. The entire teachings of the above application are incorporated herein by reference.

GOVERNMENT SUPPORT

The invention was supported, in whole or in part, by government funding under Contract No. F19628-00-C-0002 from the United States Air Force comprising Lincoln Laboratory research programs 1-98123, 2219-6, 1312, and 1598. The Government has certain rights in the invention.

BACKGROUND OF THE INVENTION

Free-space optical communications, light detection and ranging (lidar), and optical scanning all require some means of steering optical beams. Usually, fast steering and large scan angles are the two most important considerations for these applications. In some cases, the beams are hopped rather than steered from location to location, a feature sometimes known as agile beam steering.

Perhaps the most common way to steer optical beams is by reflecting the beams off mirrors or diffracting off holographic gratings mounted on mechanical scanners, such as rotating prisms, nodding scanners, and spinning or translating mounts. Mechanical scanners can easily scan beams over large angles at kilohertz rates, but steering a single beam in two dimensions requires two moving mirrors or gratings, each rotating or moving about a different axis. Steering multiple beams in two dimensions may require one pair of moving mirrors for each beam, depending on the application. Galvanometers and piezoelectric scanners tend to be bulky and generally require high-current and high-voltage servo drivers, respectively. Position drift dues to temperature fluctuations limits the pointing accuracy, as does hysteresis in the response to the servo driver.

Pairs of independently rotating prisms, such as Risley prisms, use refraction to steer optical beams over a potentially continuous range of angles. Although Risley prisms can be mounted compactly along independent rotational axes, the prisms and mounts have extremely tight manufacturing tolerances. For example, imprecisely matched prisms may not be able to steer beams along the optical axis. Further, even perfectly matched prisms must be rotated through nearly 180° to steer the beam over angles close to the optical axis. In addition, chromatic aberrations inherent in dispersive optics cause wavelength-dependent deviations in the steering angle.

Acousto-optic deflectors (AODs) can also scan beams over relatively large angles at megahertz rates. Like mechanical scanners, AODs tend to be bulky and can only steer beams in one dimension. AODs, however, can easily operate at Megahertz rates, although they need radio-frequency drive signals with power levels on the order of 500 mW. Because AODs diffract rather than reflect the incident beam, the deflection angle depends in part on the wavelength of the incident beam. AODs also diffract multiple orders (even when Bragg-matched), introducing unwanted beams into the scene being illuminated.

Micro-electro-mechanical systems (MEMS) are also used for steering and deflecting optical beams. Although MEMS devices are quite compact, their angular field-of-view in any one dimension tends to be no more than a few degrees at most. MEMS device cannot operate at rates much faster than a few kilohertz. In addition, surface effects, such as stiction (i.e., static friction), can cause MEMS components to stick in certain positions during fabrication and operation, effectively ruining the devices.

Beam steering with liquid-crystal spatial light modulators (SLMs) also tends to suffer from limited field-of-view and slow (kilohertz) steering speeds. In SLM-based scanners, a laser beam illuminates an SLM, which transmits (or reflects, depending on the device geometry) a version of the incident beam imprinted with a spatial phase modulation according to a drive signal applied to the SLM. The resulting spatial phase modulation of the transmitted (or reflected) laser beam can be transformed into a transverse displacement with a lens. Because the SLM uses polarization effects to imprint spatial phase modulation on the incident beam, only a fraction of the incident beam is transmitted (or reflected), dramatically reducing the optical transmission efficiency of the system.

Another approach to beam steering involves transmitting light through a series of cascaded decentered lenses. A first lens focuses a collimated beam to a spot in its back focal plane, which coincides with the front focal plane of a second lens. If the second lens is offset with respect to the first lens, the second lens will project a collimated beam at an angle determined by the ratio of the offset to the lens focal length. Moving the second lens sideways causes the projection angle to change, scanning the beam. Even though the scanner can be made smaller by replacing the lenses with microlens arrays, the scanner still uses moving parts. As a result, its scanning speed will be limited to kilohertz rates, at best.

In the radio-frequency domain, phased array antennas control beam angles by adjusting the relative phases of beams emitted at each antenna element. At optical frequencies, however, coherent control is quite difficult because the wavelength is so short (usually about 1 µm). Cohering multiple independent sources, even using injection-locking techniques, usually does not provide long-term phase stability needed for most beam steering applications. To see why not, consider a set of lasers emitting at a wavelength of $\lambda=850$ nm. To be coherently combined, the lasers must be phase-locked to within a fraction (no more than 5-10%) of a single period, which is about 2 ps for $\lambda=850$ nm. Similarly, splitting a beam from a single laser requires path-length matching to within a fraction of a wavelength (typically about 5-10%, or 40 nm for $\lambda=850$ nm). Unfortunately, environmental perturbations, such as thermal and mechanical drift, make it impractical to match paths to within these lengths.

SUMMARY OF THE INVENTION

Example embodiments of the present invention, referred to herein as an Agile-Beam Laser Array Transmitter (ABLAT), include methods and devices for projecting electromagnetic beams to selectable positions in an angular coverage area in a far field. Example embodiments include an array of electromagnetic emitters, where the emitters are separated from each by a first separation pitch. Each emitter generates an electromagnetic beam, which is collimated by a lens in an array of lenses with a separation pitch different from that of the emitter array. Because the emitter array and the lens array have different separation pitches, the transverse offset between the center of each emitter/lens pair is different. The lenses transform these differences in offsets into differences in angle among the collimated electromagnetic beams; propagation turns these differences in angle into differences in far-field position.

In other embodiments, the lenses may be positioned to image an active area of each emitter to a respective far-field position within an angular coverage area. Alternatively, each emitter may be positioned to emit an electromagnetic beam that fills a solid angle of a respective lens in the lens array, where the solid angle corresponds to a selectable far-field position within an angular coverage area. This causes the lens to project the electromagnetic beam to a respective far-field position within an angular coverage area that corresponds to the solid angle.

Unlike phased array antennas, the example embodiments described above do not adjust the phases of coherent beams to produce far-field projection patterns. Instead, they project single beams or combinations of incoherent beams to illuminate the angular coverage area, where the focal length of the lenses and the difference in separation pitches fixes a step size between adjacent spots. By choosing the right combination of focal length and difference in pitches, adjacent spots can be made contiguous. The lens array and emitter array may also be positioned to project beams onto overlapping areas within the angular coverage area.

In some embodiments, the emitters emit optical radiation and can be vertical-cavity surface-emitting lasers (VCSELs). The emitter array may be situated on a planar surface, which may be tilted, curved, or faceted to project at least one of the emitted electromagnetic beams at an angle relative to the surface. The electromagnetic emitters may also be grouped into subarrays with a third separation pitch, where each subarray shares a common lens in such a manner that the number of lenses can be reduced by a factor equal to the number of emitters per subarray. The lens arrays, emitter arrays, and emitter subarrays may be one-dimensional or multidimensional.

In other embodiments, the emitters may emit electromagnetic radiation at different frequencies. When the lens and emitter arrays are configured to project beams onto overlapping areas, the overlapping beams may be at different frequencies.

Still other embodiments may also include a control circuit to control the emitters in a selectable manner. The control circuit, which may be bonded to the emitter arrays in a hybridized manner, may control various beam parameters, such as the beam size, beam angle, number of beams emitted simultaneously, spatial beam modulation, temporal beam modulation, temporal beam control, or spatial beam control. The control circuit may also be configured to modulate the beams and to project them onto overlapping areas.

Embodiments of the present invention may include an ABLAT apparatus aggregated with some or all of the following: a receiver to detect electromagnetic beams emitted by the ABLAT apparatus; a reference beacon generator that emits a reference beam; an imager to detect the reference beam; and an emitter controller. The emitter controller can control projection of electromagnetic beams according to the reference beam as detected by the imager. The receiver and the reference beacon may be aligned along the same axis, parallel axes, or skew axes.

Various embodiments may be used in applications including, but not limited to: free-space optical communications; optical scanning (e.g., retinal scanning or bar-code scanning); raster-scanning projectors; display projection; light detection and ranging (lidar); image capture; optical character recognition; scanning laser microscopy; non-destructive testing; printing; facsimiles; map making; web inspection; color print processing; phototypesetting and platemaking; laser marking; material processing; DNA analysis; and drug discovery. Compared to other beam steering technologies, example embodiments of the present invention offer faster steering over a wider field of view in a much smaller package.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

FIG. 12A is a flow chart that illustrates an example of electromagnetic beam emission and projection.

FIG. 12B is a flow chart that illustrates an example of electromagnetic beam selection by an emitter controller.

DETAILED DESCRIPTION OF THE INVENTION

A description of example embodiments of the invention follows.

Figure 1A:
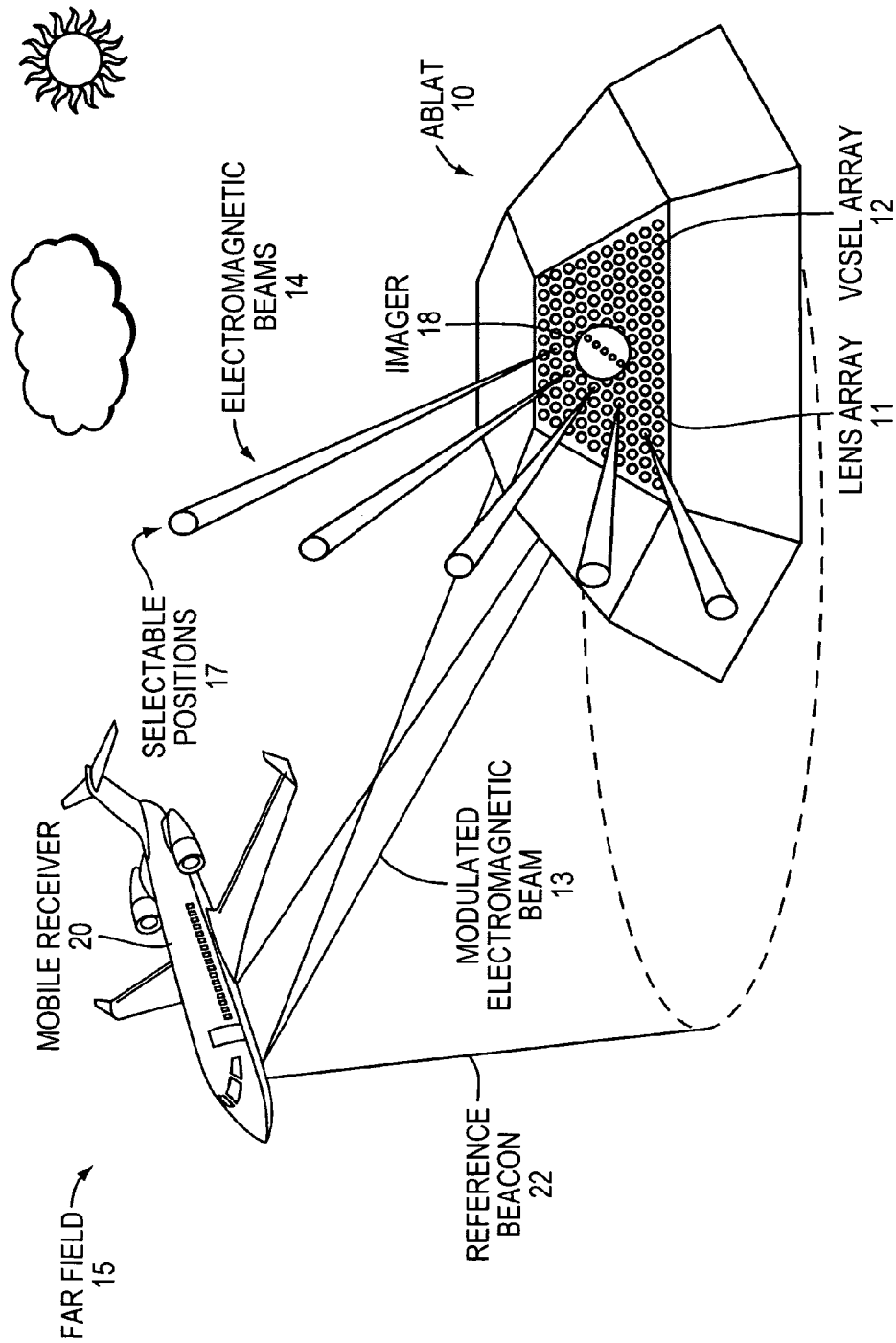
FIG. 1A is a system-level diagram that illustrates free-space optical communication between an Agile-Beam Laser Array Transmitter (ABLAT), according to an example embodiment of the present invention, and a mobile receiver equipped with a reference beacon generator.

FIG. 1A is a system-level diagram that illustrates free-space optical communications between an Agile-Beam Laser Array Transmitter (ABLAT) 10 and mobile receiver 20, such as an unmanned aerial vehicle, airplane, helicopter, car, truck, or other vehicle. The mobile receiver 20 shown in FIG. 1A uses a beacon generator (not shown) to project a reference beacon 22 towards an imager 18 mounted with the ABLAT 10. A control circuit determines the angle-of-arrival of the reference beacon 22 using the signal detected by the imager 18, then causes the ABLAT 10 to project a modulated electromagnetic beam 13 towards the mobile receiver 20, completing the communications link between the ABLAT 10 and the mobile receiver 20. The reference beacon can also be modulated to permit two-way communication between the mobile receiver 20 and the ABLAT 10.

The ABLAT 10 shown in FIG. 1A is mounted on a faceted surface and includes a two-dimensional (2D) hexagonal lens array 11 coupled to a 2D hexagonal vertical-cavity surface-emitting laser (VCSEL) array 12. As explained in greater detail below, mismatch in the array pitches makes it possible to project electromagnetic beams 14 to different selectable positions 17 in a far field 15. The ratio of the mismatch to the lens focal lengths determines the angular separation between selectable positions 17; the total number of VCSEL/lens pairs determines the extent of the angular coverage area. Distributing the lens and VCSEL arrays 11, 12 on a faceted surface, as shown in FIG. 1A, further increases the angular coverage area.

Figure 1B:
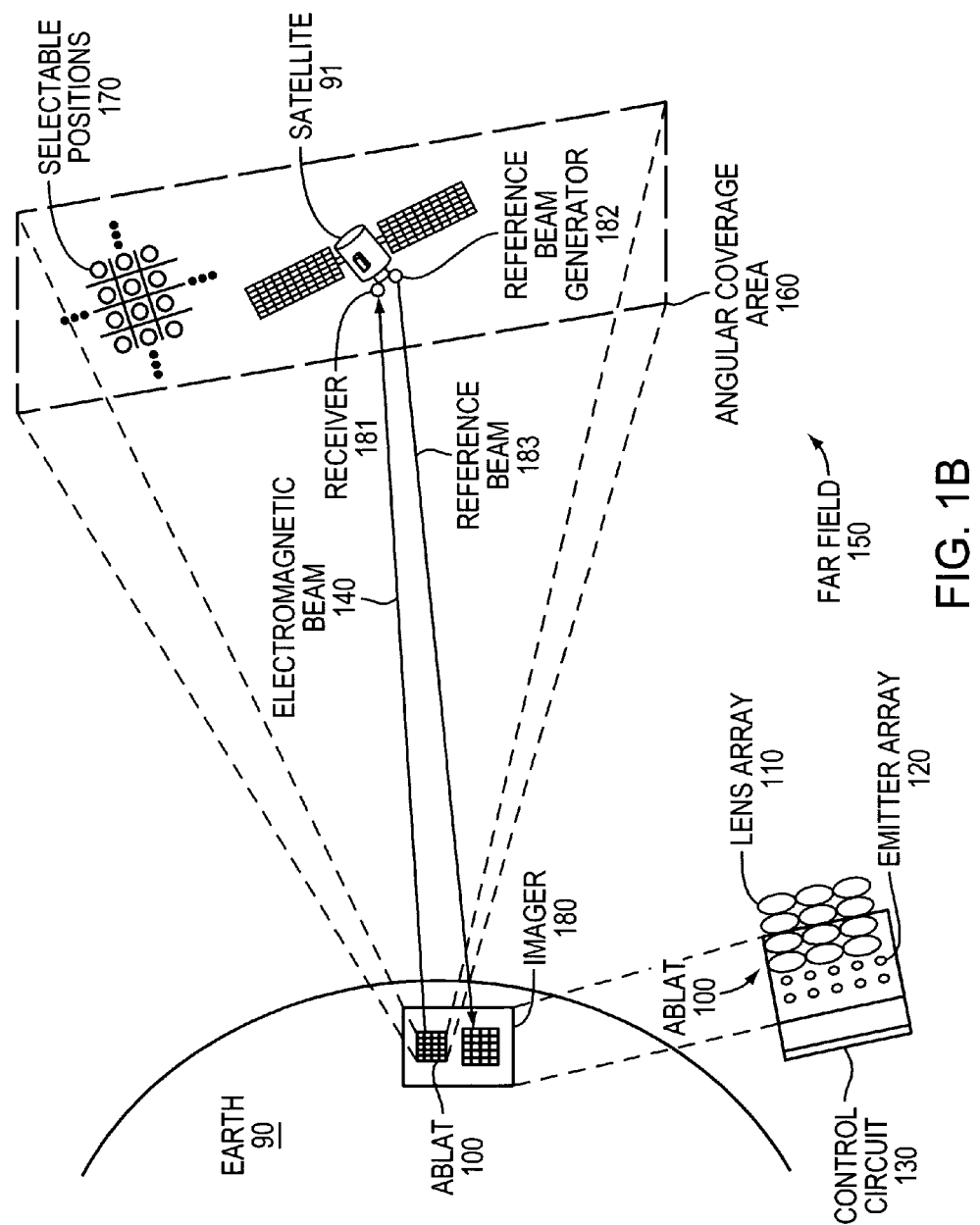
FIG. 1B is a system-level diagram that illustrates free-space optical communication between an ABLAT, according to an example embodiment of the present invention, and a satellite equipped with a receiver and a reference beacon generator.

FIG. 1B is a system-level diagram that illustrates free-space optical communications between an ABLAT 100 on Earth 90 and a receiver 181 on a satellite 91. The ABLAT 100 includes a lens array 110 and an emitter array 120, where each array has a different pitch separating respective individual elements or groups of elements. The ABLAT 100 projects electromagnetic beams 140 to selectable positions 170 in an angular coverage area 160 in the far field 150. The configuration of the ABLAT 100—specifically, the difference in pitches of the lens array 110 and the emitter array 120—determines the size of the angular coverage area 160, the number of selectable positions 170, and the resolvable angle between positions. Propagation maps the different angles into different selectable positions 170 in the far field 150.

The system shown in FIG. 1B uses a reference beacon generator 182 to select a position 170 in the far field 150, such as illustrated by a grid in the far field 150, that matches the location of a receiver 181 on the satellite 91. The reference beacon generator 182, which may or may not be aligned along the same axis as the receiver, transmits a reference beam 183 towards an imager 180 situated near the ABLAT 100. The imager 180 senses the reference beam 183 in a particular location in an image plane (not shown), which a control circuit 130 translates into an angle of arrival of the reference beam 183. The control circuit 130 determines the position of the receiver 181 from the angle of arrival, then directs the ABLAT 100 to project a beam 140 to the receiver 181, completing the free-space optical communications link.

Figure 2:
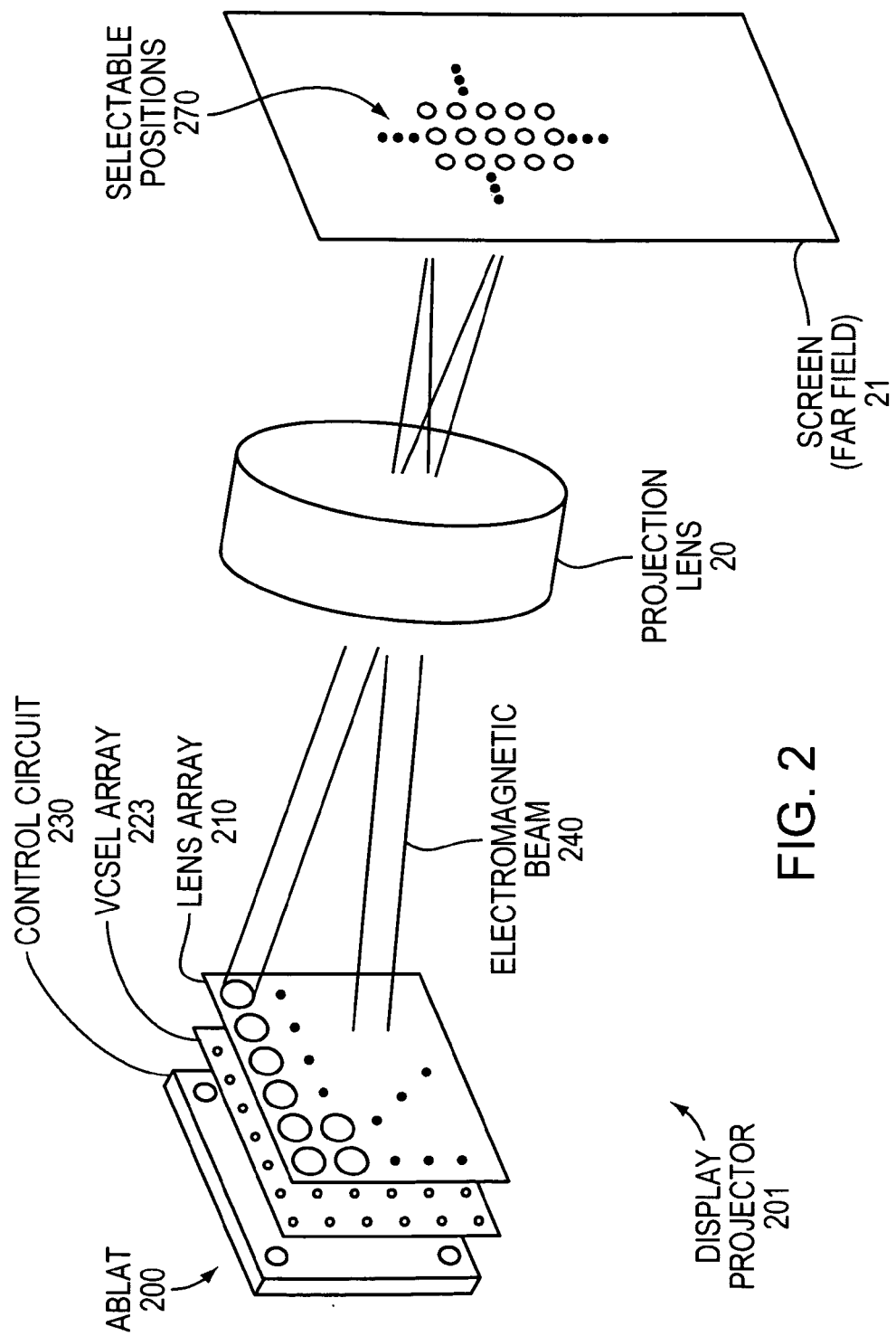
FIG. 2 is a schematic diagram that illustrates a display projector based on an ABLAT apparatus.

FIG. 2 is a schematic diagram of an ABLAT 200 used in a display projector 201. For displays, the electromagnetic beams 240 must be at visible wavelengths, so the emitter array 220 in this case is an array of visible-band vertical-cavity surface-emitting lasers (VCSELs) 223. Again, a control circuit 230 directs the beams 240 projected by the VCSEL array 223 through a lens 210 onto selectable positions 270 in the far field. Here, a projection lens 20 forms an image of the ABLAT 100 on a far-field screen 21. Given the fast switching speed of the VCSEL array 223 and the control circuit 230, displayed light produced by combinations of the electromagnetic beams 240 on the screen 21 may depict moving images, static images, or both.

Figure 3:
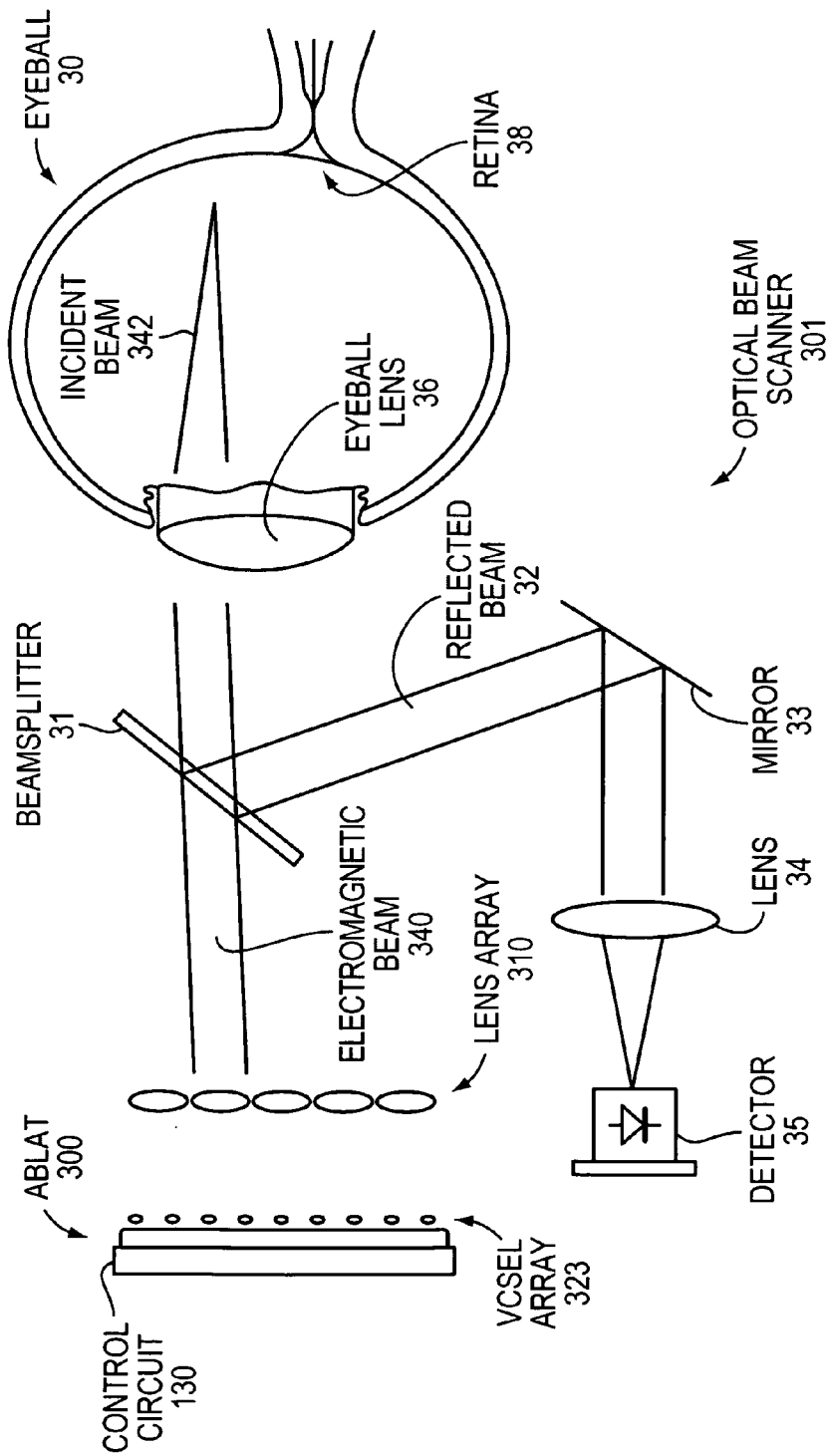
FIG. 3 is a schematic diagram that illustrates retinal scanning with an ABLAT apparatus.

FIG. 3 is a schematic diagram that illustrates an ABLAT 300 used in an optical beam scanner 301, such as a retinal scanner. The ABLAT 300 projects a beam 340 through a beamsplitter 31 onto an eyeball 30 comprising an eyeball lens 36 and a retina 38. The eyeball lens 36 focuses the beam onto the retina 38, which reflects a portion of the incident beam 342. The reflected beam 32 propagates back through the eyeball 30 to the beamsplitter 31, which reflects the reflected beam 32 onto a mirror 33. The mirror 33 reflects the reflected beam 32 through a lens 34 onto a detector 35. Recording the intensity of the reflected beam 32 as a function of the position of the projected electromagnetic beam 340 produces a retinal reflectance map. In other embodiments, the ABLAT 300 may emit broadband or chirped beams for use in optical coherence tomography or optical frequency-domain imaging, respectively. Interferometric detection of the reflected broadband or chirped beams yields information about both the longitudinal and transverse structure within the eyeball.

It should be understood that the optical beam scanner 301 is a simplified example. More lenses, mirrors, or other passive or active elements or devices known in the art may be employed in other embodiments. The scanner can also be used to probe other physiological or mechanical structures. For example, different ABLATs 300 could be used in a variety of optical beam scanners for non-destructive testing of aircraft parts, pressure vessels, pipes, and even ropes and cables in suspension bridges.

Figure 4:
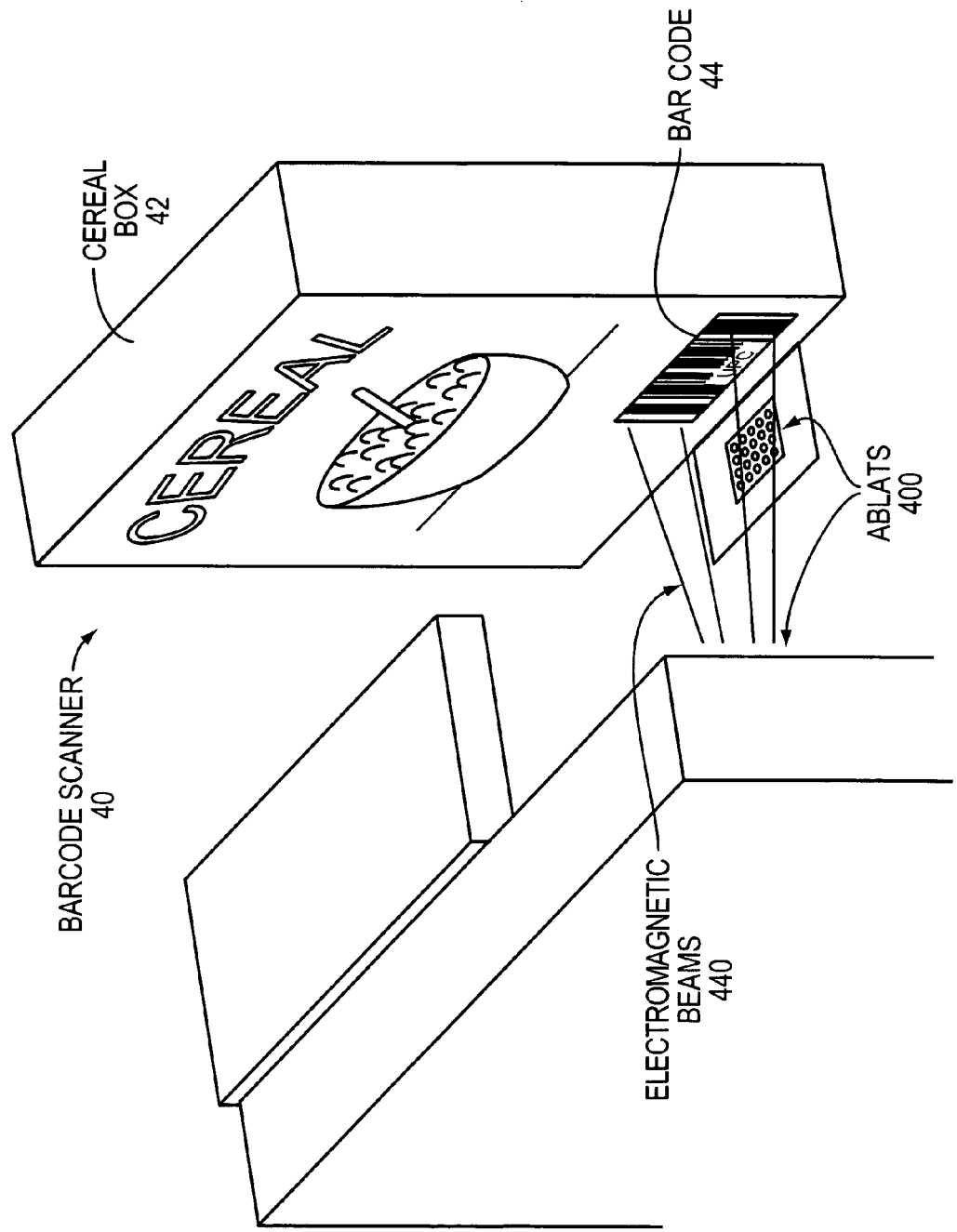
FIG. 4 is a schematic diagram that illustrates a bar code scanner based on an ABLAT apparatus.

FIG. 4 is a schematic diagram that illustrates a supermarket checkout that includes a barcode scanner 40 employing an ABLAT 400. As a checker swipes an item, such as a box of cereal 42, across the barcode scanner 40, the ABLAT 400 projects electromagnetic beams 440 that interrogate the cereal box's barcode 44. In this illustration, the barcode 44 is a Universal Product Code (UPC) barcode, but different embodiments of the barcode scanner 40 can recognize any appropriate type of barcode 44. For example, other embodiments of the barcode scanner 40 could be used to scan 2D barcodes, such as those used in overnight shipping. Handheld barcode scanners 40, such as those used to track packages or verify inventories, can also employ embodiments of the ABLAT 400.

Other applications include, but are not limited to: light detection and ranging (lidar), scanning laser microscopy, image capture, printing, laser marking, material processing, DNA analysis, and drug discovery. In lidar-based collision avoidance systems, for example, an ABLAT could be used to project beams in the direction of travel. The time delay associated with backscattered and reflected beams gives an indication of the distance to objects in the projected travel path. The small size of ABLATs enables lidar systems small enough to mount on vehicles including cars, trucks, airplanes, unmanned aerial vehicles, and spacecraft.

Figure 5:
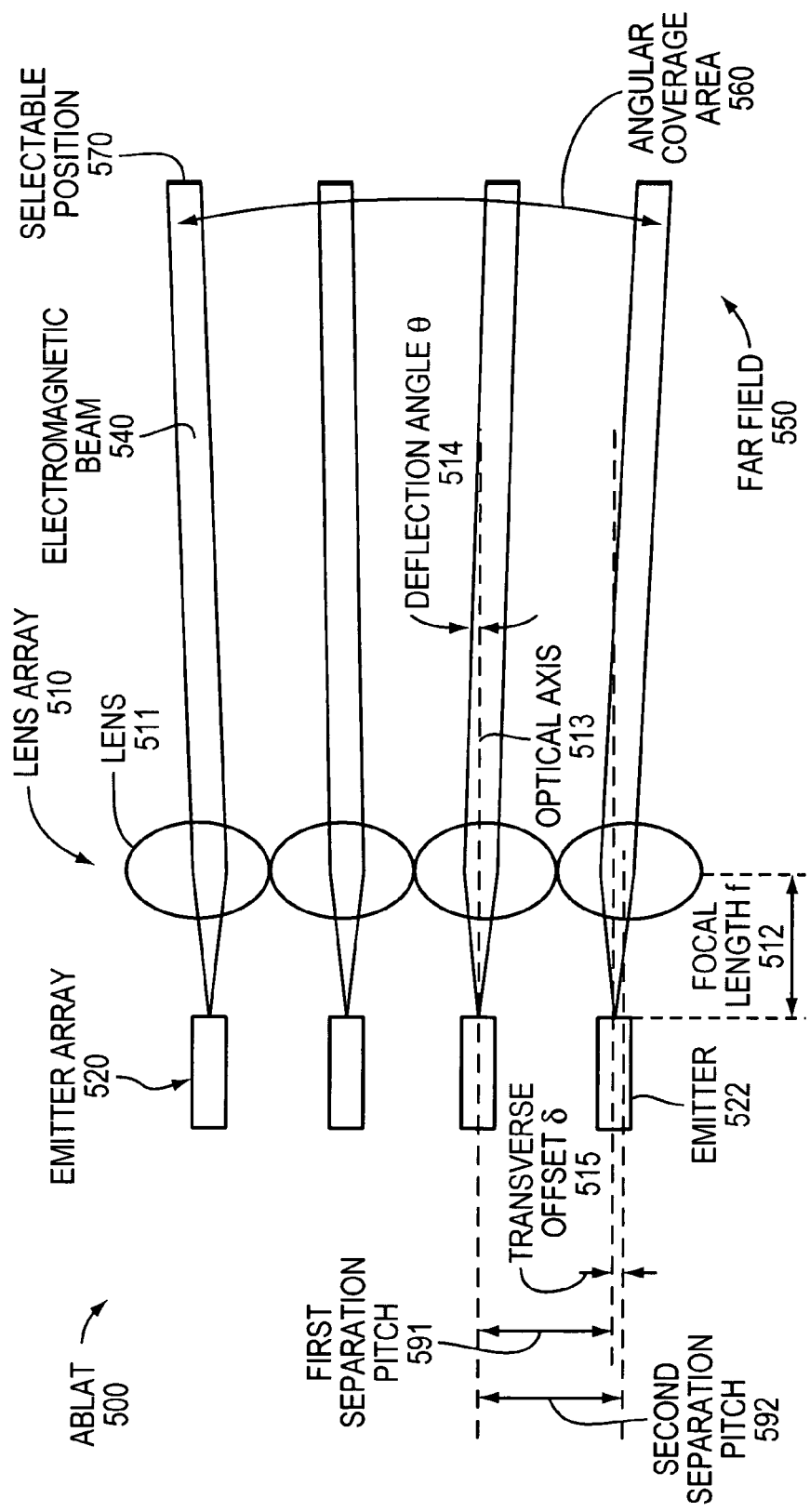
FIG. 5 is a schematic view of an embodiment of an ABLAT apparatus.

FIG. 5 is a schematic diagram that illustrates certain common features among an example ABLAT 500. Here, an emitter array 520 includes emitters 522 separated by a first separation pitch 591, where each emitter 522 emits an electromagnetic beam 540. A lens array 510 of lenses 511, characterized by a focal length 512 and separated by a second separation pitch 592, collimates the beams 540 and projects them to the far field 550. Alternatively, the lenses 511 can be positioned to image the active areas of the emitters 522 to selectable positions 570 in the far field (imaging to a point that is far enough away is equivalent to collimating in many respects). Each emitter 522 can also be positioned to project an electromagnetic beam 540 that fills a solid angle of respective lens 511, which projects the beam 540 to a selectable position 570 that corresponds to the solid angle.

The lens array 510 may be arranged in one- or multidimensional arrays; two-dimensional arrays, for example, may be arranged in square lattices, rectangular lattices, hexagonal lattices, sparse lattices, or any other suitable lattice configuration. As shown in FIG. 5, the diameter of the lens 511 equals the second separation pitch 591, although those skilled in the art will appreciate that the diameter of the lens 511 may also be less than the second separation pitch 591. In other words, the fill factor of the lens array 510 depends on the embodiment. Depending on the size of the ABLAT 500, the lenses 511 may be lenslets or microlenses.

A transverse offset 515 between an emitter 522 and the corresponding lens 511 causes the corresponding projected beam 540 to propagate at a deflection angle 514 relative to the optical axis 513 of the lens according to the following equation, $$\theta = \tan^{-1}\left(\frac{\delta}{F}\right), \quad (1)$$

where θ is the deflection angle 514, δ is the transverse offset 515, and F is the focal length 512. Because the lens and emitter arrays 510, 520 have different separation pitches 591, 592, the transverse offsets 515 are different for each lens/emitter pair. As a result, each lens/emitter pair projects a beam at a different deflection angle 514 to a different selectable position 570. The ratio of the difference in separation pitches 591, 592 and the lens focal lengths 512 determines the angular coverage area 560 and angular step size between deflection angles 514. Generally speaking, the angular coverage area 560 may range from about 1°×1° to about 40°×40° for a square array, with an angular step size determined by the number and arrangement of emitters in the array.

Figure 6:
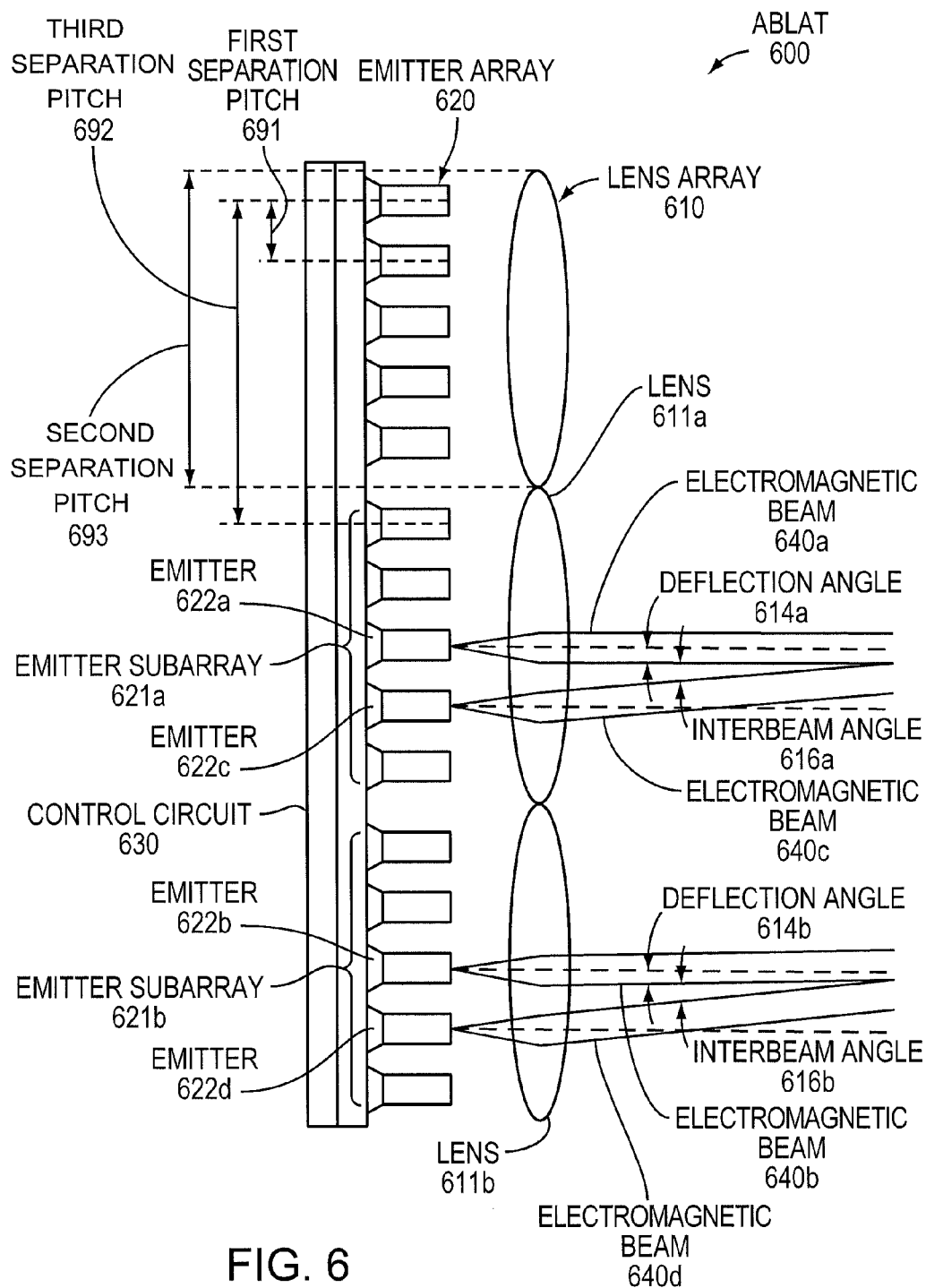
FIG. 6 is a schematic view of an embodiment of an ABLAT apparatus that employs subarrays of electromagnetic emitters.

FIG. 6 is a schematic diagram that illustrates an ABLAT 600 that allows for wide angular coverage areas 660 in a compact package. Arranging emitters 622 into emitter subarrays 621a, 621b with a third separation pitch 693 allows the emitters 622 in subarrays 621a, 621b to share respective common lenses 611a, 611b. Instead of one-to-one emitter/lens mapping as in FIG. 5, the emitter/lens mapping is N-to-one, where N is the number of emitters per subarray 621a, 621b. This reduces the number of lenses required to cover the same angular coverage area 660 by a factor of N because interbeam angles 616a, 616b vary in part with the first separation pitch 691 while deflection angles 614a, 614b depend in part on the third separation pitch 693.

For example, consider emitters 622a, 622b in the centers of subarrays 621a, 622b, respectively, and corresponding lenses 611a, 611b as shown in FIG. 6. As illustrated, the center of emitter 622a is aligned with the center of lens 611a. Because the offset is zero, an electromagnetic beam 640a emitted by emitter 622a propagates along the optical axis of lens 611a— in other words, it has a deflection angle 614a of 0°. In contrast, the center of emitter 622b is slightly offset with respect to the center of lens 611b because the third separation pitch 693 causes a shift in the relative transverse alignment of emitter subarray 621b with respect to lens 611b. As a result, electromagnetic beam 640b propagates at a nonzero deflection angle 614b after being collimated by lens 611b.

Figure 7:
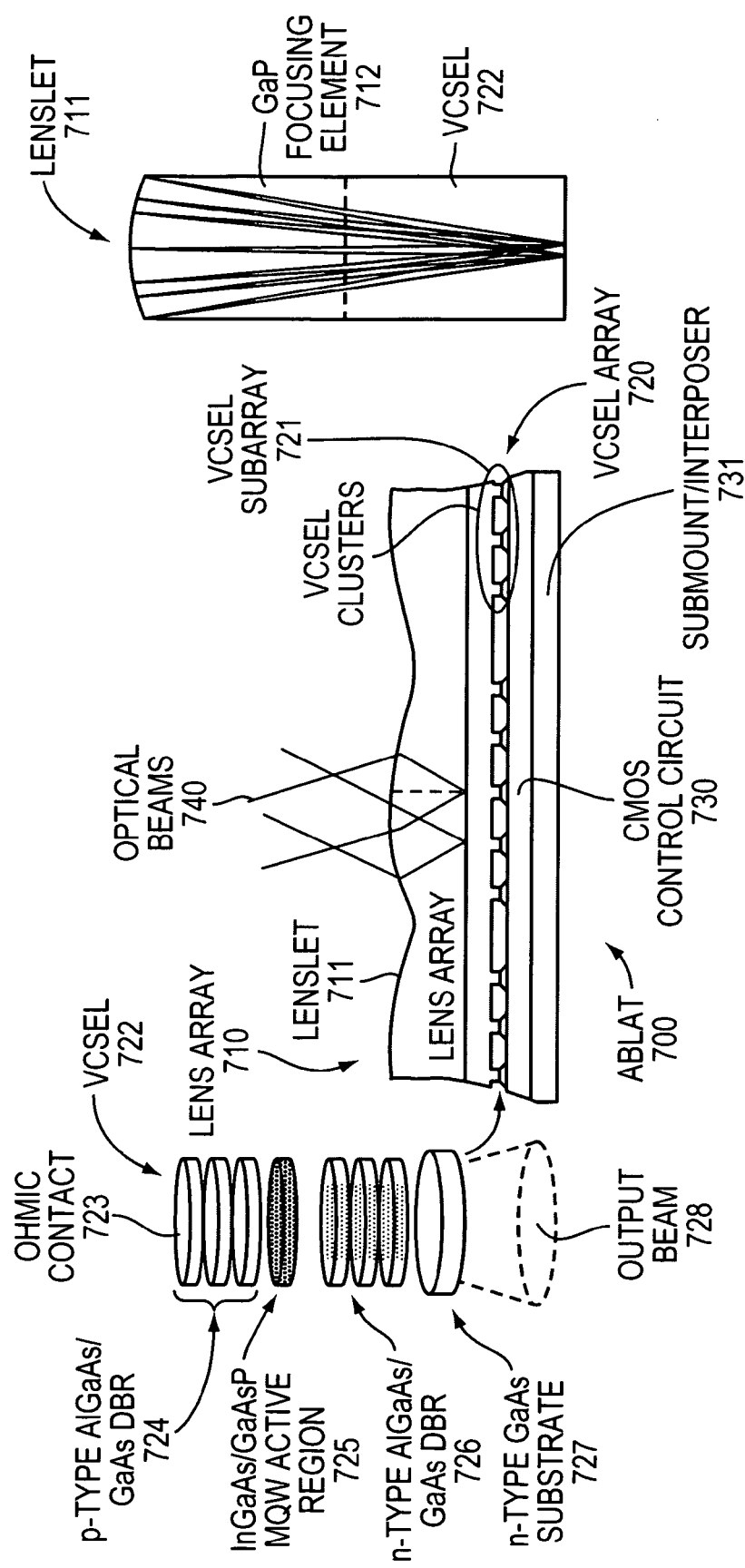
FIG. 7 is a schematic view of an embodiment of an ABLAT apparatus that employs subarrays of vertical-cavity surface-emitting lasers (VCSELs), which are shown in an exploded view.

FIG. 7 is a schematic diagram that shows a preferred embodiment of an ABLAT 700 where the emitters are vertical-cavity surface-emitting lasers (VCSELs) 722, an example of which is shown in an exploded view. The VCSELs 772 are grouped into subarrays 721 that form a larger array 720 similar to the arrangement of arrays and subarrays shown in FIG. 6. Like the subarrays and arrays shown in FIG. 6, each subarray 721 is situated near a corresponding lenslet 711. The lenslets 711 form a lenslet array 710 with a separation pitch that is different than the separation pitch of the VCSEL array 720. As described above, the difference in separation pitches means that different VCSELs 720 project beams to different positions in the far field. Also as described above, using a single lenslet 711 to project beams from multiple VCSELs 722 results in a reduction in the total number of lenslets 711.

The lens array 710 and the VCSEL array 720 are bonded to a complementary metal-oxide-semiconductor (CMOS) control chip 730, which, in turn, is mounted on a submount/interposer 731. The CMOS control chip 730 can be used to modulate the projected beams 740 in space and/or time, depending on the application. For example, the CMOS control chip 730 can be used to project one or more beams in a raster pattern for optical scanning.

Like other lasers, a VCSEL 722 (an exploded view of which is shown upside down with respect to the ABLAT 700) includes reflectors that surround a gain region. In a VCSEL 722, however, the reflectors are distributed Bragg reflectors (DBRs) 724 and 726 doped to form a p-n junction as shown in FIG. 7. The DBRs 724 and 725, which are alternating layers of AlGaAs and GaAs, surround an InGaAs/GaAsP multiple quantum well (MQW) active region 725 sandwiched between buffer regions (not shown). Biasing the VCSEL 722 with a current flowing through an ohmic contact 723 and an n-type GaAs substrate 727 causes the VCSEL 722 to emit an output beam 728 through an active area on the substrate 727, which is projected with a lens 711 to a far-field position. As shown at right, the lens may be a GaP focusing element 712 bonded directly to the VCSEL 722.

ABLATs may also be arranged in 2D arrays, as described in greater detail below. In a preferred embodiment, an ABLAT includes VCSELs that emit light at a wavelength of λ=980 nm arranged in a 32×32 square array, where each VCSEL has an intrinsic angular divergence of about 20° (350 milliradians). To cover an ABLAT angular field of regard of θ=±7.5° (i.e., a 260-milliradian cone) with 60% beam overlap along the major axis, the microlens must impart a beam divergence of 1.2° (21 milliradians) to each VCSEL beam. For a 15 μm diameter multimode VCSEL, this requirement fixes the focal length at F=711 μm.

At the maximum ABLAT beam projection angle of θ=±7.5° (±130 milliradians), the associated VCSEL must be offset from the center of the lens by δ=93 μm according to Eq. (1). The incremental step size in projection angle for consecutive beam positions is 0.47° and the step size in VCSEL offset is Δδ=6.0 μm. In other words, the separation pitch of the VCSEL array is 6.0 μm larger (or smaller) than the separation pitch of the lens array. The minimum microlens diameter is given by multiplying the lens focal length, F, by the native VCSEL beam divergence angle, then adding twice the offset, 2δ, to the resulting product. In this case, the nominal lens diameter is about 430 μm, corresponding to an f/# of about 1.7.

Figure 8A:
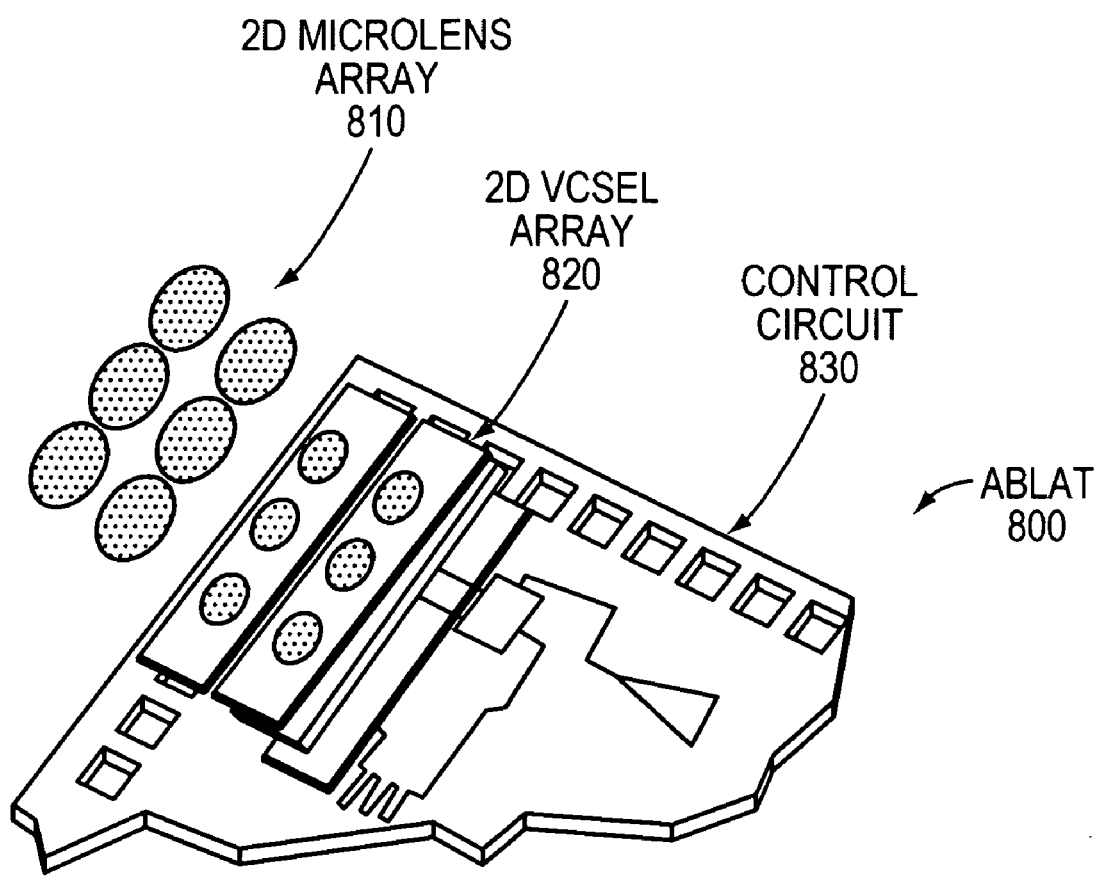
FIGS. 8A-C are diagrams of two-dimensional (2D) ABLAT apparatuses.

FIG. 8A is a schematic diagram of an exploded view of a 2D ABLAT 800. This embodiment of the ABLAT 800 includes a 2D microlens array 810 stacked on a 2D VCSEL array 820, which, in turn, is coupled to a control circuit 830. Depending on the application, the control circuit 830 can be a digital signal processor, field-programmable gate array, application-specific integrated circuit, general-purpose programmable processor, or any other suitable processor.

The precision of the separation pitches of the arrays 810, 820 and of their alignment determines the precision of the angular step size. Non-uniformities in step size due to misalignment or imprecise manufacturing can be compensated (at least in part) by measuring the actual projection angle of each emitted beam and programming or designing the control circuit 830 accordingly. Similarly, holes in the projection pattern created by dead VCSELs can be mapped and, if the ABLAT 800 is designed to overfill the angular coverage area, eliminated by appropriately programming or designing the control circuit 830.

Figure 8B:
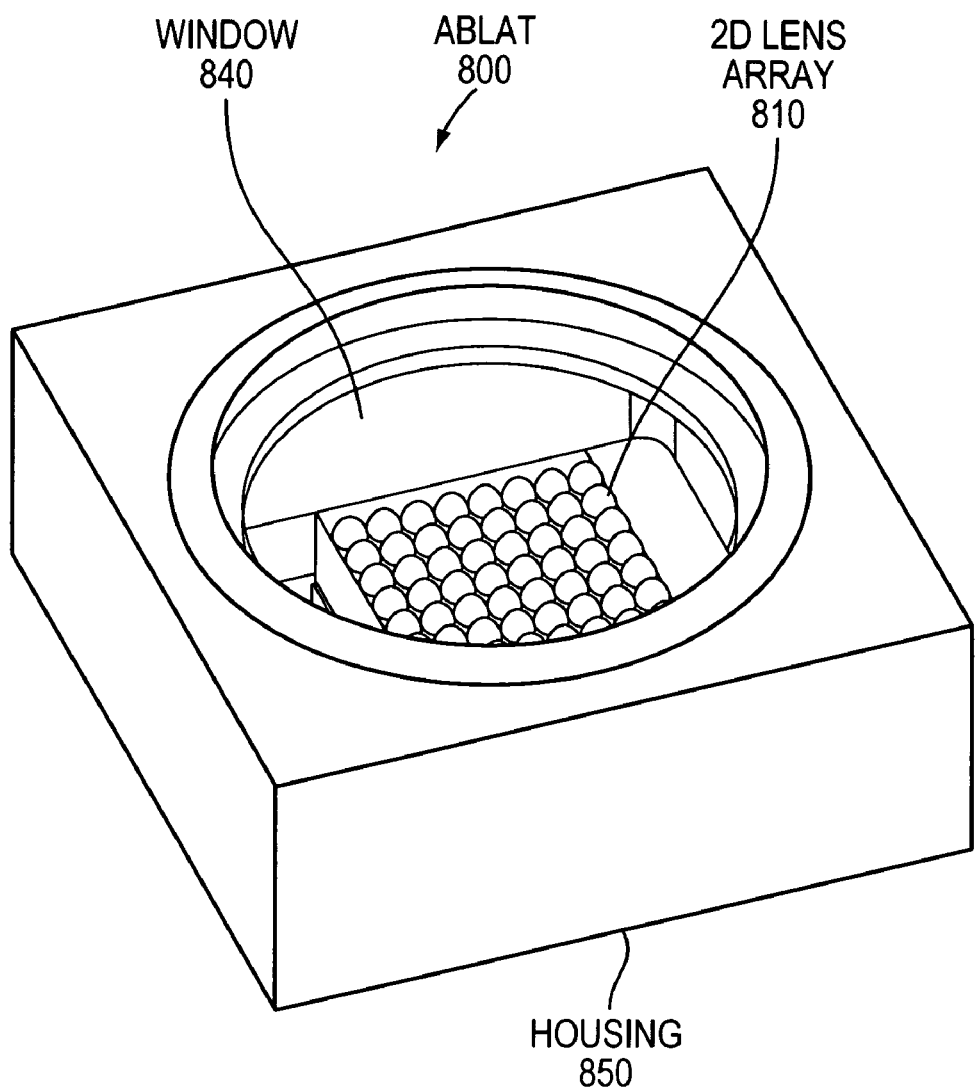

FIG. 8B is a schematic diagram that shows another view of a 2D ABLAT 800. In this view, the ABLAT 800 is enclosed in a housing 850 that includes a protective window 840, which may be coated with a scratch-resistant and/or anti-reflective coating. The housing 850 may also include mechanical mounts and conduits for electrical and thermal connections to the ABLAT 800 or a control circuit.

Figure 8C:
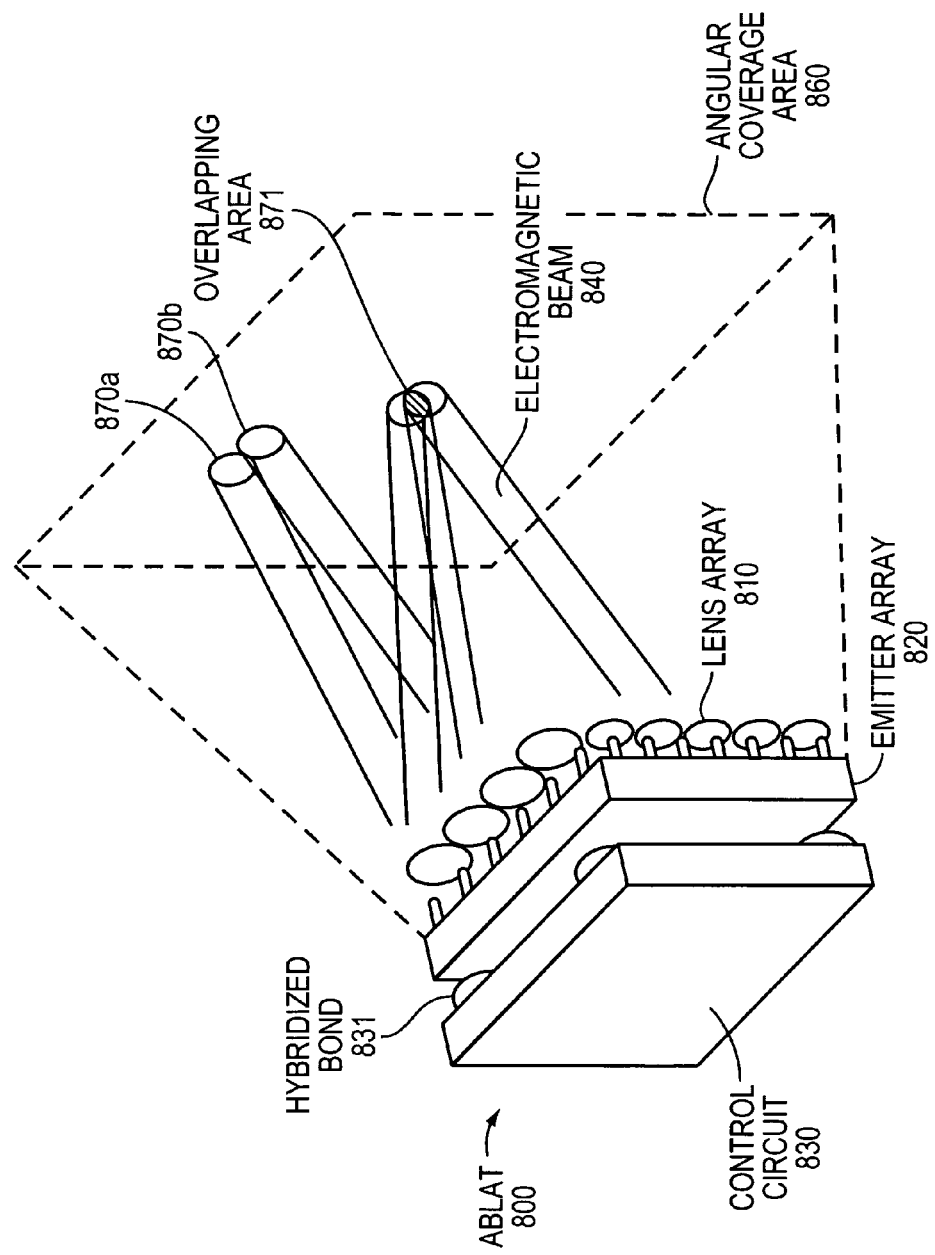

FIG. 8C is a schematic diagram of an ABLAT 800 projecting electromagnetic beams 840 to various positions in an angular coverage area 860. The ABLAT 800 projects a pair of beams 840 onto contiguous selectable positions 870a, 870b and another separate set of beams 840 onto an overlapping area 871. In some embodiments, the beams 840 may be at different frequencies, a useful feature for color displays. Consider three beams 840 at the wavelengths corresponding to red, green, and blue (roughly 650 nm, 550 nm, and 450 nm, respectively). If these three beams 840 overlap, the overlapping area 871 appears white.

The ABLAT 800 may be driven or controlled by a control circuit 830 that selects and modulates the electromagnetic beams 840, such as shown in FIGS. 7 and 8A-C. For example, the control circuit 830 may connected to the ABLAT 800 using a hybridized bond 831 such as a bump bond or other suitable bond. The control circuit 830 may cause the element(s) of the emitter array 820 to turn beams 840 on and off, to determine which positions 870 are illuminated, or to project beams onto overlapping areas 871. For example, the control circuit 830 can be used to implement a full-color display by selectively directing beams 840 at different frequencies to overlapping areas 871. In addition, for embodiments employing VCSEL arrays 823, the control circuit 830 can easily modulate the beams at Megahertz rates—in some embodiments, the only practical limitation on modulation rate (given an appropriate emitter 822) is the speed of the control circuit 830.

FIGS. 9A-D are schematic diagrams that illustrate various embodiments of ABLATs situated on faceted surfaces. More generally, an ABLAT may be arranged on a curved, tilted, or warped surface to increase the angular coverage area. By choosing an appropriate surface, focal length, and separation pitches, an ABLAT can provide an angular coverage area of an arbitrary solid angle or arrangement of solid angles up to $4\pi$ steradians, i.e., total angular coverage.

Figure 9B:
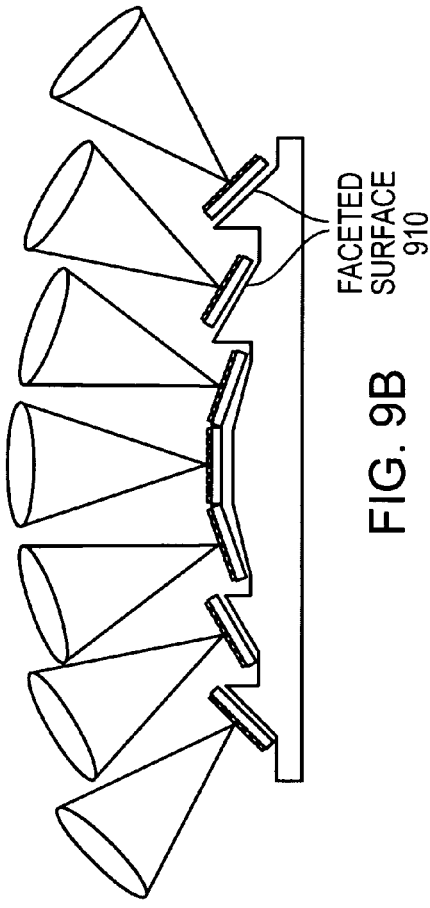
FIGS. 9A-D are schematic diagrams that illustrate different embodiments of 1D and 2D ABLAT apparatuses arrayed on different multifaceted surfaces.
Figure 9A:
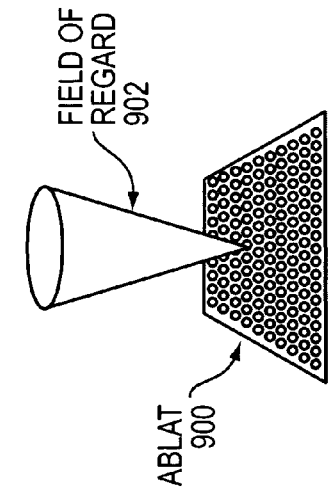

FIG. 9A is a schematic diagram of a building block ABLAT 900 that may incorporate a detector. Preferred implementations include 32×32, 1 $cm^2$ and 64×64, 4 $cm^2$ square arrays with 10°×10° and 20°×20° fields-of-regard 902, respectively. The 32×32 square array includes 4×4 clusters of VCSELs, resulting in a VCSEL chip that is about 5 $mm^2$ and a CMOS chip that is about 7 $mm^2$. For comparison, the ABLAT 800 shown in FIG. 8B is about 13.5 $mm^2$, but does not include a beacon imager, discussed in greater detail below. Adding a beacon imager increases the size to over 1 $cm^2$.

Figure 9D:
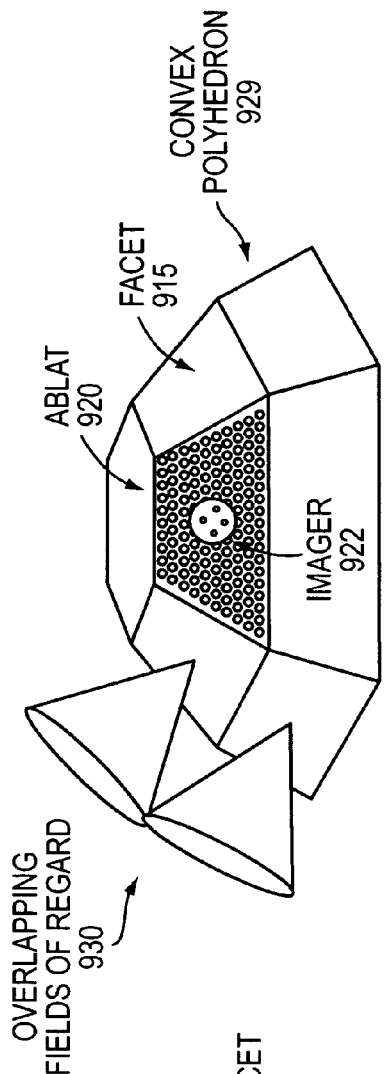
Figure 9C:
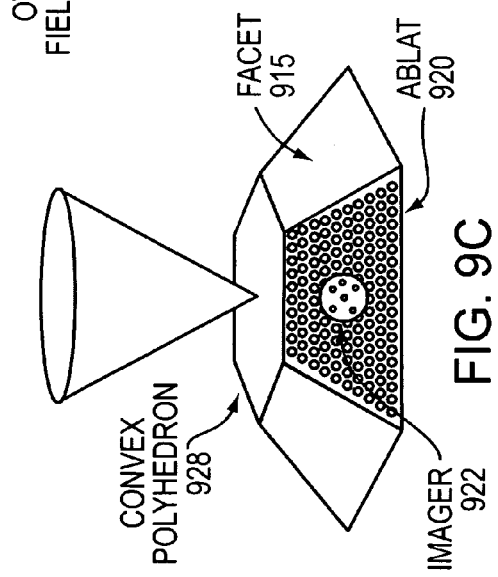

Building block ABLATs 900 can be arranged on a variety of faceted surfaces, including those shown in FIGS. 9B-D. For example, tiling the faceted surface 910 shown in FIG. 9B with 32×32 ABLATs 900 results in a device with a 70° field-of-view and a length of about 7 cm (smaller than a credit card). Alternatively, ABLATs 920 with imagers 922 can be tiled on convex polyhedra 928 and 929, as shown FIGS. 9C and 9D respectively, where the number and orientation of facets 915 help determine the size and distribution of the angular coverage area. The multi-faceted ABLAT shown in FIG. 9D has overlapping fields-of-regard 930 that cover more than $2\pi$ steradians in a compact device with an exceptionally small footprint.

The embodiments shown in FIGS. 5-9 can each be configured to project electromagnetic beams onto separate, contiguous, and overlapping areas within the angular coverage area. In some embodiments, the selectable positions that can be addressed by the electromagnetic beams may illuminate the entire angular coverage area. In other embodiments, the selectable positions may overlap substantially within the angular coverage area, whereas in still other embodiments, the addressable selectable positions may cover less than the entire angular coverage area. Some embodiments may be able to address sparse or non-uniform arrangements of selectable positions of the angular coverage area, where angular coverage subareas may be under-filled, exactly filled, or over-filled.

Figure 10:
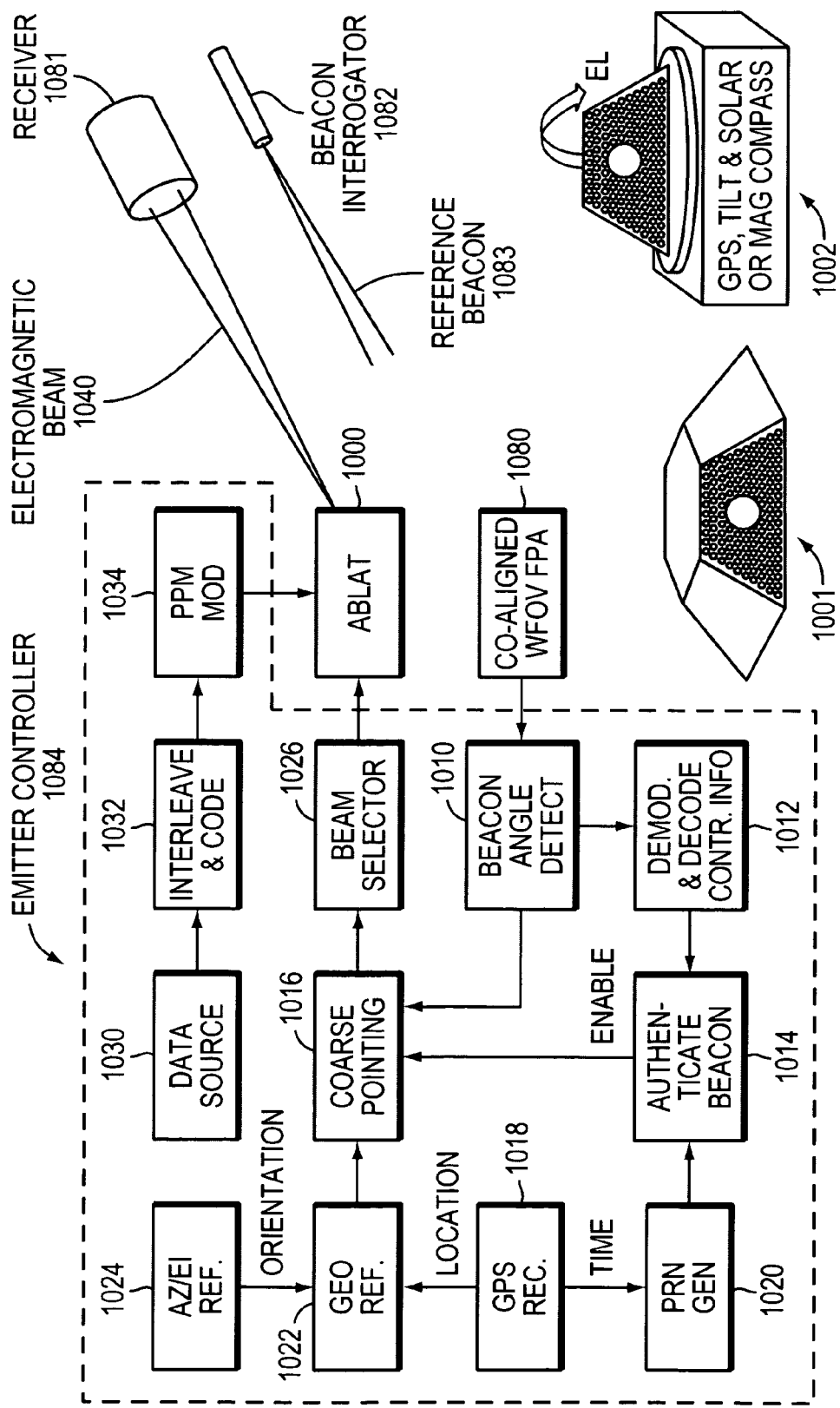
FIG. 10 is a block diagram that illustrates a free-space optical communication system according to embodiments of the present invention.

FIG. 10 is a block diagram that illustrates how an emitter controller 1084 can be used together with an ABLAT 1000 to illuminate particular positions in the far field. The example shown in FIG. 10 further illustrates an aspect of the embodiment shown in FIG. 1. In the embodiment of FIG. 10, the ABLAT 1000 forms a feedback loop with an imager 1080, receiver 1081, and beacon interrogator 1082. The beacon interrogator 1082 emits a reference beacon 1083, which illuminates the imager 1080 at a particular angle of arrival (AOA). The imager 180 detects the reference beam at a particular location in an image plane, where the particular location depends on the AOA of the reference beacon 1083. The emitter controller 1084 determines the AOA from the location in the image plane, then directs the ABLAT 1000 to project a beam to the corresponding receiver 1081. Depending on the application, the receiver 1081 and reference beacon generator 1082 may or may not point in the same direction; the same holds for the ABLAT 1000 and the imager 1080.

In the embodiment shown in FIG. 10, the imager 1080 is a focal-plane array (FPA) which has a wide field-of-view (WFOV) aligned along the same axis as the WFOV of the ABLAT 1000. Other suitable imagers include, but are not limited to, CMOS arrays, charge-coupled devices, quadrant-cell detectors, hub-and-spoke detectors, or any other type of imaging array. The imager 1080 detects the reference beacon 1083, which may be modulated with an authentication code, and transmits a signal to a beacon AOA detector 1010.

The beacon AOA detector 1010 determines the approximate AOA of the reference beacon 1083 and passes signals to a coarse pointing block 1016 and a demodulator/decoder 1012. The demodulator/decoder 1012 processes the received reference beacon 1083 to decode it so that an authenticator 1014 can verify that the imager 1080 has detected the desired beacon 1083. If the beacon 1083 is modulated using spread-spectrum techniques, such as those using pseudo-random noise (PRN) codes, then the authenticator 1014 and demodulator/decoder 1012 can use a PRN generator 1020 to demodulate the received beacon 1083. After successfully authenticating the reference beacon 1083, the authenticator 1014 then enables the coarse pointing block 1016, together with a beam selector 1026, to select a particular beam 1040 to project from the ABLAT 1000 based on the AOA of the received reference beacon 1083.

Accurately pointing the projected electromagnetic beam 1040 may also require knowing the orientation and location of the ABLAT 1000 and imager 1080. As shown in FIG. 10, an azimuth/elevation block 1024 can be used to establish a desired attitude of the ABLAT 1000 and imager 1080, which may be mounted on a movable stage 1002. The stage 1002 and/or azimuth/elevation block 1024 can be coupled to a magnetic compass, solar or celestial tracker, or global positioning system (GPS) receiver 1018 to improve attitude and orientation determination. Alternatively, the ABLAT 1000 and image 1080 can be mounted on a faceted surface 1001, fixing the relative attitude and orientation of the array.

The emitter controller 1084 uses data from the azimuth/elevation block 1024 and GPS receiver 1018 to determine the absolute or relative position of the ABLAT 1000 or image 1080 with a geospatial reference block 1022. The geospatial reference block 1022, in turn, is coupled to the coarse pointing block 1016, which may use the determined position to refine the pointing accuracy. The emitter controller 1084 can also include a fine pointing block (not shown) to further improve the pointing accuracy of the project electromagnetic beam 1040.

To carry information to the receiver 1081, the projected electromagnetic beam 1040 is modulated with information from a data source 1030, such as a communications link, transponder, or identification friend-or-foe module. An interleave and code block 1032 and a pulse-position modulation (PPM) modulator 1034 modulate the beam 1040 emitted by the ABLAT 1000 with information from the data source 1030. For an ABLAT 1000 with VCSELs, which have extremely fast switching times, the modulation rate can be on the order of Gigahertz, although lower modulation rates are possible. The achievable modulation rate depends on the modulator and the electronics used to control the ABLAT 1000, the speed and bandwidth of the receiver 1081, and the energy per bit that the ABLAT 1000 is capable of delivering.

Optical communications systems typically use incoherent modulation techniques, such as PPM or M-ary frequency shift keying, due to the difficulty of phase-locking optical signals for coherent detection. Because free-space optical communications systems tend to operate along lines-of-sight, multipath interference does not affect received signals, making PPM a particularly good choice of modulation scheme. Synchronization between the transmitter and the receiver is very important in PPM, which encodes information using the arrival times of a sequence of on/off pulses. Differential PPM avoids synchronization issues by encoding arrival time of given pulse relative to that of the preceding pulse. Alternatively, the GPS receiver 1018 and PRN generator 1020 can be used to precisely estimate the time for both beacon authentication and modulation synchronization.

Figure 11A:
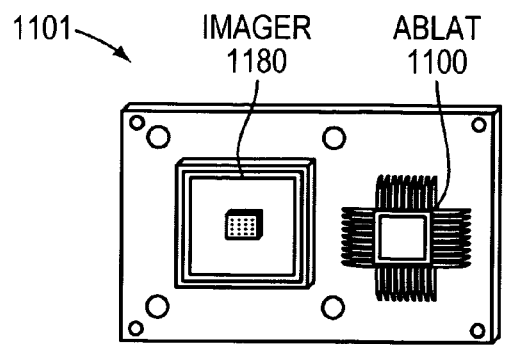
FIGS. 11A-C are perspective views of optical communications boards including 2D ABLAT apparatuses.
Figure 11B:
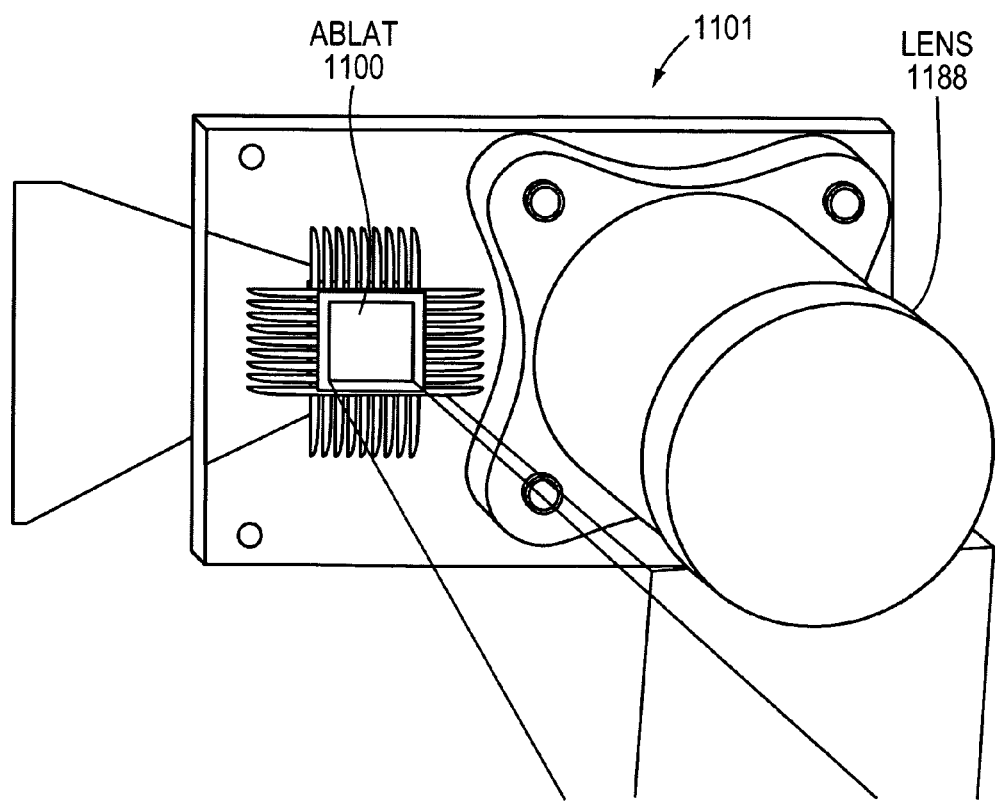
Figure 11C:
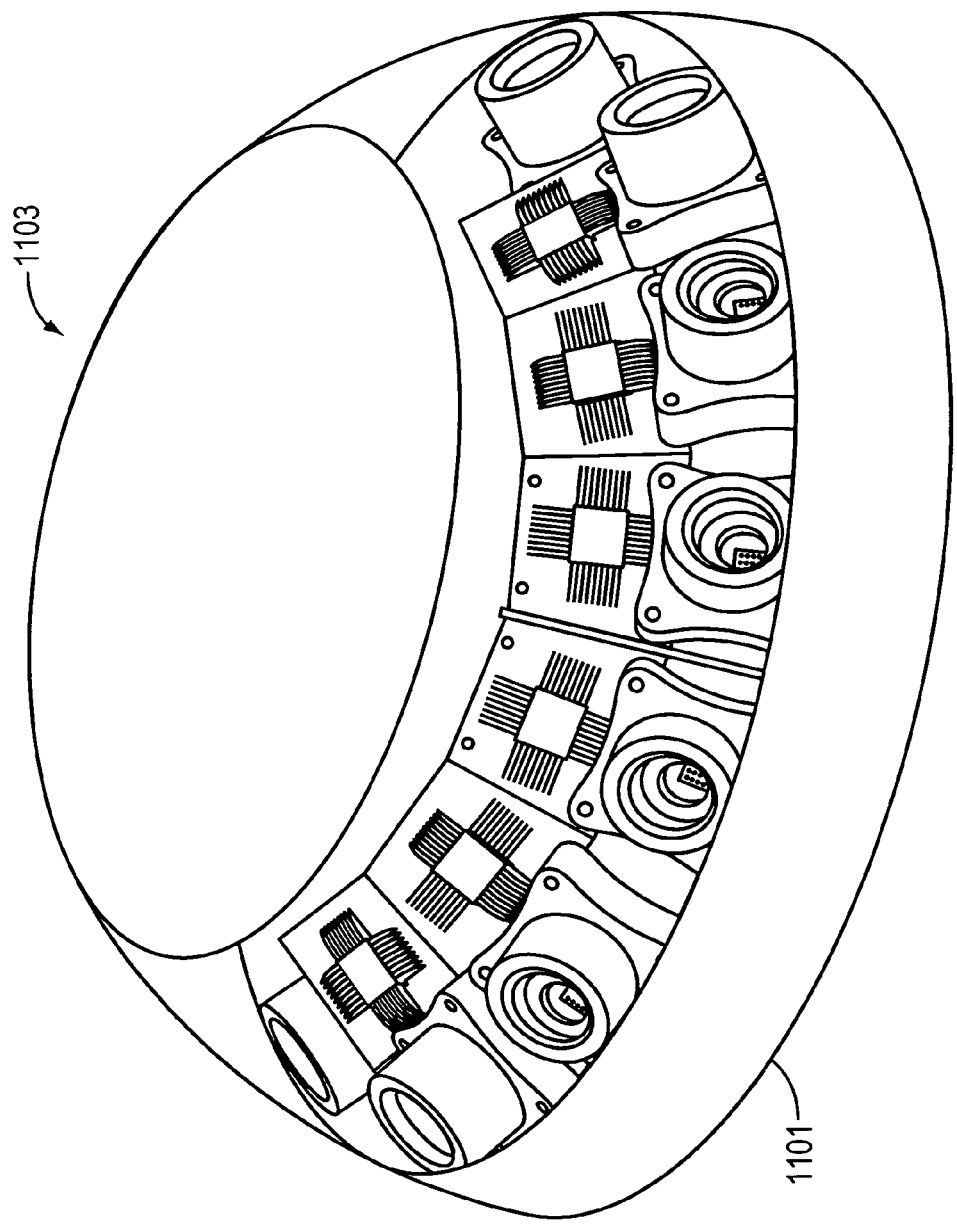

FIGS. 11A-C are perspective drawings of an optical communications board 1101 employing a 2D ABLAT 1100. As shown in FIG. 11A, the ABLAT 1100 and imager 1180 are aligned along parallel axes (in other words, they are or co-boresighted). The offset between the ABLAT 1100 and imager 1180 results in parallax, which can be compensated using beam-steering electronics. If the offset between the receiver and reference beacon generator is known, the parallax can be used to compute the distance between the receiver and the optical communications board 1101.

FIG. 11B shows another view of the optical communications board 1101 with a lens mounted to the imager 1180. Multiple optical communications boards 1101 can be mounted on a faceted surface within a protective housing 1103 to provide a wider field of view, as shown in FIG. 11C. Since each of the communication boards 1101 functions independently, the arrangement depicted in FIG. 11C provides multi-user access by means of space-division multiplexing.

FIG. 12A is a flow diagram of an example embodiment of a procedure 1200 of projecting electromagnetic beams. First, at least one electromagnetic beam is emitted from an array of electromagnetic emitters that has a first separation pitch between adjacent emitters (1201). Next, the emitted electromagnetic beams are projected to a selectable far-field position within an angular coverage area using an array of lenses (1202). The array of lenses has a second separation pitch between adjacent lenses that is different than the first separation pitch of the emitter array.

FIG. 12B is a flow diagram of an example embodiment of a procedure 1250 executed by an emitter controller, such as emitter controller 1084 shown in FIG. 10. First, an imager detects the reference beam (1252). Second, the emitter controller determines the reference beam's AOA and the position of the corresponding receiver (1254). Third, the emitter controller determines which selectable position matches the angular location of the receiver (1256). The emitter controller then causes the emitter array to project a corresponding electromagnetic beam (1258), completing the loop.

It should be understood that the emitter controller may be implemented in the form of hardware, firmware, or software. If implemented in software, the software my be any language suitable to implement a procedure presented herein. The software may be in the form of instructions capable of being stored on a medium readable by a processor. The processor may be any form of processor, such as a digital signal processor, general purpose processor, or matrix processor, to execute the software in a manner known in the art to execute any procedure or combination(s) of procedures illustrated by way of example herein.

While this invention has been particularly shown and described with references to example embodiments thereof, it will be understood by those skilled in the art that various changes in form and details may be made therein without departing from the scope of the invention encompassed by the appended claims.

What is claimed is:

1. An apparatus for projecting an electromagnetic beam, the apparatus comprising:
   an array of electromagnetic emitters, the emitters configured to generate electromagnetic beams;
   an array of lenses positioned to project the electromagnetic beams to the selectable far-field position,
   the array of electromagnetic emitters further comprising subarrays of N electromagnetic emitters per subarray, each subarray sharing a common lens,
   the electromagnetic emitters within each subarray having a first separation pitch between the adjacent electromagnetic emitters, the lenses in the array of lenses having a second separation pitch between the adjacent lenses, and the subarrays having a third separation pitch between the adjacent subarrays,
   the first and second separation pitches being different from each other and having a difference which, in combination with the focal lengths of the lenses, defines a step size in projecting the electromagnetic beams to a selectable far-field position within an angular coverage area.

2. The apparatus of claim 1, wherein the electromagnetic emitters emit optical radiation.

3. The apparatus of claim 2, wherein the electromagnetic emitters are vertical-cavity surface-emitting lasers (VCSELs).

4. The apparatus of claim 1, wherein the first separation pitch is greater than the second separation pitch.

5. The apparatus of claim 1, wherein the second separation pitch is greater than the first separation pitch.

6. The apparatus of claim 1, wherein the electromagnetic beams are combined incoherently.

7. The apparatus of claim 1, wherein the array of electromagnetic emitters and the array of lenses are aligned to project the electromagnetic beams to contiguous locations, the contiguous locations substantially covering the angular coverage area.

8. The apparatus of claim 1, wherein the array of emitters and the array of lenses are positioned to project the electromagnetic beams on overlapping areas within the angular coverage area.

9. The apparatus of claim 8, further comprising a control circuit configured to modulate the electromagnetic beams.

10. The apparatus of claim 9, wherein the electromagnetic beams projected on overlapping areas are of different wavelengths.

11. The apparatus of claim 1, further comprising a planar surface upon which the array of electromagnetic emitters is situated.

12. The apparatus of claim 1, further comprising a curved surface upon which the array of electromagnetic emitters is situated.

13. The apparatus of claim 1, further comprising a faceted surface upon which the array of electromagnetic emitters and the array of lenses are situated.

14. The apparatus of claim 1, wherein the subarrays are multidimensional.

15. The apparatus of claim 1, wherein the subarrays emit electromagnetic radiation at different wavelengths.

16. The apparatus of claim 1, further comprising a control circuit configured to control the emitters in a selectable manner.

17. The apparatus of claim 16, wherein the control circuit controls at least one of the following parameters: beam size; beam angle; temporal beam modulation; spatial beam modulation; and number of beams emitted simultaneously.

18. The apparatus of claim 17, wherein the control circuit is configured to be coupled to the array of emitters in a hybridized manner.

19. An apparatus for projecting an electromagnetic beam, the apparatus comprising:
an array of electromagnetic emitters, configured to be controlled by an emitter controller and, the emitters configured to generate electromagnetic beams;
an array of lenses positioned to project the electromagnetic beams to a selectable far-field position within an angular coverage area,
the array of electromagnetic emitters further comprising subarrays of N electromagnetic emitters per subarray, each subarray sharing a common lens,
the electromagnetic emitters within each subarray having a first separation pitch between the adjacent electromagnetic emitters, the lenses in the array of lenses having a second separation pitch between the adjacent lenses, and the subarrays having a third separation pitch between the adjacent subarrays,
the first and second separation pitches being different from each other; and
a receiver, reference beacon generator, and imaging system, the imaging system configured to detect the reference beacon and provide an input to the emitter controller to activate a subset of the emitters to project the electromagnetic beam onto the receiver.

20. The apparatus of claim 19, wherein the receiver and the reference beacon are aligned along the same axis.

21. The apparatus of claim 19, wherein the receiver and the reference beacon are aligned along different axes.

22. A method for projecting an electromagnetic beam, the method comprising:
emitting an array of electromagnetic beams, said array including subarrays of electromagnetic beams, the beams in each subarray having a first separation pitch between the adjacent electromagnetic beams; and
projecting the electromagnetic beams to respective selectable far-field positions within an angular coverage area through an array of lenses having a second separation pitch between the adjacent lenses,
wherein projecting said electromagnetic beams includes projecting the electromagnetic beams emitted by each subarray through a lens common to said subarray,
wherein projecting the electromagnetic beams to respective selectable far-field positions is performed as a function of a second separation pitch, different from the first separation pitch, the first separation pitch and the second separation pitch having a difference which, in combination with a focal length, defines a step size in projecting the electromagnetic beams to the selectable far-field position.

23. The method of claim 22 wherein emitting electromagnetic beams further includes emitting optical radiation.

24. The method of claim 23, wherein the electromagnetic beams are provided by electromagnetic emitters, including vertical-cavity surface-emitting lasers (VCSELs).

25. The method of claim 22 wherein the first separation pitch is greater than the second separation pitch.

26. The method of claim 22 wherein the second separation pitch is greater than the first separation pitch.

27. The method of claim 22 further including incoherently combining the electromagnetic beams.

28. The method of claim 22 wherein the selectable far-field positions are contiguous locations that substantially cover the angular coverage area.

29. The method of claim 22 wherein projecting the electromagnetic beams to a selectable far-field position further includes projecting plural electromagnetic beams to an overlapping area.

30. The method of claim 29, further comprising modulating the electromagnetic beams.

31. The method of claim 30, wherein the plural electromagnetic beams projected on the overlapping area are of different wavelengths.

32. The method of claim 22 wherein emitting electromagnetic beams further includes emitting electromagnetic beams from a planar surface.

33. The method of claim 22 wherein emitting electromagnetic beams further includes emitting electromagnetic beams from a curved surface.

34. The method of claim 22 wherein emitting electromagnetic beams further includes emitting electromagnetic beams from a faceted surface.

35. The method of claim 22, wherein emitting the array of electromagnetic beams further includes emitting multidimensional arrays of electromagnetic beams.

36. The method of claim 22, wherein emitting the array of electromagnetic beams further includes emitting electromagnetic beams at different wavelengths.

37. The method of claim 22 further comprising controlling the emission of the electromagnetic beams in a selectable manner.

38. The method of claim 37, wherein controlling the emission of the electromagnetic beams includes controlling at least one of the following: beam size; beam angle; temporal beam modulation; spatial beam modulation; and number of beams emitted simultaneously.

39. A method for projecting an electromagnetic beam, the method comprising:
emitting an array of electromagnetic beams, said array including subarrays of electromagnetic beams, the beams in each subarray having a first separation pitch between the adjacent electromagnetic beams;

projecting the electromagnetic beams to respective selectable far-field positions within an angular coverage area through an array of lenses having a second separation pitch between the adjacent lenses, wherein said projecting is performed as a function of a second separation pitch different from the first separation pitch, wherein projecting the electromagnetic beams includes projecting the electromagnetic beams emitted by each subarray through a lens common to said subarray;

detecting a reference beacon; and controlling emission and projection of at least a subset of the electromagnetic beams in response to the detected reference beacon.

40. The method of claim 39, wherein controlling emission and projection of at least a subset of the electromagnetic beams includes projecting at least one electromagnetic beam onto a receiver.

41. The method of claim 40, wherein projecting at least one electromagnetic beam further includes projecting an electromagnetic beam along an axis aligned with the reference beacon.

42. The method of claim 40, wherein projecting at least one electromagnetic beam further includes projecting an electromagnetic beam along an axis not aligned with the reference beacon.

43. A method for projecting an electromagnetic beam, the method comprising:

emitting an array of electromagnetic beams by emitters adjacent to each other, said array including subarrays of electromagnetic beams, the beams in each subarray having a first separation pitch between the adjacent electromagnetic beams;

projecting the electromagnetic beams to respective selectable far-field positions within an angular coverage area through an array of lenses having a second separation pitch between the adjacent lenses, wherein said projecting is performed as a function of the second separation pitch different from the first separation pitch, wherein projecting the electromagnetic beams includes projecting the electromagnetic beams emitted by each subarray through a lens common to said subarray;

detecting a reference beacon; and controlling emission and projection of at least a subset of the electromagnetic beams in response to the detected reference beacon.

44. The method of claim 43, wherein emitting electromagnetic beams further includes emitting optical radiation.

45. An apparatus for projecting an electromagnetic beam, comprising:

an array of lenses having a first separation pitch between adjacent lenses; and an array of electromagnetic emitters comprising subarrays of N electromagnetic emitters, each subarray having a second separation pitch between the adjacent emitters, the second separation pitch being different from the first separation pitch, the first and second separation pitches having a difference which, in combination with the focal length of the lenses, defines a step size in projection the electromagnetic beams to a selectable far-field position within an angular coverage area, the emitters configured to generate electromagnetic beams, each electromagnetic beam filling a solid angle of a respective lens, the solid angle corresponding to the selectable far-field position, the array of electromagnetic emitters having a third separation pitch between the adjacent subarrays, the third separation pitch being different from the first and second separation pitches.

46. The apparatus of claim 45, wherein the electromagnetic emitters are vertical-cavity surface-emitting lasers (VCSELs).

47. The apparatus of claim 45, further including a control circuit configured to control at least one of the following parameters: beam size; beam angle; temporal beam modulation; spatial beam modulation; and number of beams emitted simultaneously.

48. A method for projecting an electromagnetic beam, the method comprising:

emitting electromagnetic beams at a first separation pitch;

filling respective solid angles at a second separation pitch with the electromagnetic beams, the second separation pitch being different from the first separation pitch and having a difference which in combination with a focal length defines a step size in projecting the electromagnetic beams to a selectable far-field position within an angular coverage area; and projecting the electromagnetic beams to respective selectable far-field positions within an angular coverage area, the selectable far-field positions corresponding to the respective solid angles, wherein emitting the electromagnetic beams includes emitting at least one subset of the electromagnetic beams at a third separation pitch, different from the first and second separation pitches, and wherein projecting said electromagnetic beams includes refracting the at least one subset of electromagnetic beams emitted at the third separation pitch through a common lens.

49. The method of claim 48, wherein emitting electromagnetic beams includes emitting optical radiation.

50. The method of claim 48, further including controlling at least one of the following parameters: beam size; beam angle; temporal beam modulation; spatial beam modulation; and number of beams emitted simultaneously.

51. An apparatus for projecting an electromagnetic beam, comprising:

an array of electromagnetic emitters, said array comprising subarrays of N emitters, each subarray having a first separation pitch between adjacent emitters, the emitters configured to generate electromagnetic beams; and an array of lenses having a second separation pitch between adjacent lenses, the first and second separation pitches being different from each other, the lenses being positioned to project the electromagnetic beams to a selectable far-field position within an angular coverage area;

the subarrays of N electromagnetic emitters having a third separation pitch, each subarray sharing a common lens, and the number of common lenses being reduced by N relative to an array of electromagnetic emitters without subarrays; and a receiver, reference beacon generator, and imaging system, the imaging system configured to detect the reference beacon and provide an input to the emitter controller to activate a subset of the emitters to project the electromagnetic beams onto the receiver.

52. The apparatus of claim 51 wherein the subarrays are multidimensional.

53. The apparatus of claim 51 wherein the subarrays emit electromagnetic radiation at different wavelengths.

54. The apparatus of claim 51 wherein the electromagnetic emitters emit optical radiation.

55. The apparatus of claim 51 wherein the electromagnetic emitters are vertical-cavity surface-emitting lasers (VCSELs).

56. The apparatus of claim 51 wherein the first separation pitch is greater than the second separation pitch.

57. The apparatus of claim 51 wherein the second separation pitch is greater than the first separation pitch.

58. The apparatus of claim 51 wherein the electromagnetic beams are combined incoherently.

59. The apparatus of claim 51 wherein the difference in first and second separation pitches in combination with the focal lengths of the lenses defines a step size in projecting the electromagnetic beams to the selectable far-field position.

60. The apparatus of claim 51 wherein the array of electromagnetic emitters and the array of lenses are aligned to project the electromagnetic beams to contiguous locations, the contiguous locations substantially covering the angular coverage area.

61. The apparatus of claim 51 wherein the array of emitters and the array of lenses are positioned to project the electromagnetic beams on overlapping areas within the angular coverage area.

62. The apparatus of claim 61 further comprising a control circuit configured to modulate the electromagnetic beams.

63. The apparatus of claim 62 wherein the electromagnetic beams projected on overlapping areas are of different wavelengths.

64. The apparatus of claim 51 further comprising a planar surface upon which the array of electromagnetic emitters is situated.

65. The apparatus of claim 51 further comprising a curved surface upon which the array of electromagnetic emitters is situated.

66. The apparatus of claim 51 further comprising a faceted surface upon which the array of electromagnetic emitters and the array of lenses are situated.

67. The apparatus of claim 51 further comprising a control circuit configured to control the emitters in a selectable manner.

68. The apparatus of claim 67 wherein the control circuit controls at least one of the following parameters: beam size; beam angle; temporal beam modulation; spatial beam modulation; and number of beams emitted simultaneously.

69. The apparatus of claim 68 wherein the control circuit is configured to be coupled to the array of emitters in a hybridized manner.

70. The apparatus of claim 51 wherein the receiver and the reference beacon are aligned along the same axis.

71. The apparatus of claim 51 wherein the receiver and the reference beacon are aligned along different axes.

72. A method for projecting an electromagnetic beam, the method comprising:
emitting an array of electromagnetic beams by emitters, said array including subarrays of electromagnetic beams, the beams in each subarray having a first separation pitch between the adjacent electromagnetic beams;
projecting the electromagnetic beams to respective selectable far-field positions within an angular coverage area through an array of lenses having a second separation pitch between the adjacent lenses, wherein said projecting is performed as a function of lenses having a second separation pitch different from the first separation pitch, wherein projecting the electromagnetic beams includes projecting the electromagnetic beams emitted by each subarray through a lens common to said subarray;
detecting a reference beacon; and
controlling emission and projection of at least a subset of the electromagnetic beams in response to the detected reference beacon.

73. The method of claim 72 wherein emitting electromagnetic beams further includes emitting electromagnetic beams in multidimensional arrays separated by the third separation pitch.

74. The method of claim 72 wherein emitting electromagnetic beams further includes emitting electromagnetic beams at different wavelengths.

75. The method of claim 72 wherein emitting electromagnetic beams further includes emitting optical radiation.

76. The method of claim 75 wherein the electromagnetic beams are provided by electromagnetic emitters, including vertical-cavity surface-emitting lasers (VCSELs).

77. The method of claim 72 wherein the first separation pitch is greater than the second separation pitch.

78. The method of claim 72 wherein the second separation pitch is greater than the first separation pitch.

79. The method of claim 72 further including incoherently combining the electromagnetic beams.

80. The method of claim 72 wherein the difference in separation pitches in combination with a focal length defines a step size in projecting the electromagnetic beams to the selectable far-field position.

81. The method of claim 72 wherein the selectable far-field positions are contiguous locations that substantially cover the angular coverage area.

82. The method of claim 72 wherein projecting the electromagnetic beams to a selectable far-field position further includes projecting plural electromagnetic beams to an overlapping area.

83. The method of claim 82 further comprising modulating the electromagnetic beams.

84. The method of claim 82 wherein the plural electromagnetic beams projected on the overlapping area are of different wavelengths.

85. The method of claim 72 wherein emitting electromagnetic beams further includes emitting electromagnetic beams from a planar surface.

86. The method of claim 72 wherein emitting electromagnetic beams further includes emitting electromagnetic beams from a curved surface.

87. The method of claim 72 wherein emitting electromagnetic beams further includes emitting electromagnetic beams from a faceted surface.

88. The method of claim 72 further comprising controlling the emission of the electromagnetic beams in a selectable manner.

89. The method of claim 88 wherein controlling the emission of the electromagnetic beams includes controlling at least one of the following: beam size; beam angle; temporal beam modulation; spatial beam modulation; and number of beams emitted simultaneously.

90. The method of claim 89 wherein controlling emission and projection of at least a subset of the electromagnetic beams includes projecting at least one electromagnetic beam onto a receiver.

91. The method of claim 72 wherein projecting at least one electromagnetic beam further includes projecting an electromagnetic beam along an axis aligned with the reference beacon.

92. The method of claim 72 wherein projecting at least one electromagnetic beam further includes projecting an electromagnetic beam along an axis not aligned with the reference beacon.

* * * * *